US010826530B2

(12) United States Patent
Ma et al.

(10) Patent No.: US 10,826,530 B2
(45) Date of Patent: Nov. 3, 2020

(54) METHOD FOR GENERATING BASE MATRIX OF LDPC CODE, ENCODING/DECODING METHOD, AND DEVICE

(71) Applicant: Huawei Technologies Co., Ltd., Shenzhen, Guangdong, P.R. (CN)

(72) Inventors: Liang Ma, Shanghai (CN); Yuejun Wei, Shanghai (CN); Chen Zheng, Shanghai (CN); Xin Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/279,551

(22) Filed: Feb. 19, 2019

(65) Prior Publication Data

US 2019/0181883 A1 Jun. 13, 2019

Related U.S. Application Data

(63) Continuation of application No. PCT/CN2016/096112, filed on Aug. 19, 2016.

(51) Int. Cl.
*H03M 13/11* (2006.01)
*H03M 13/00* (2006.01)

(52) U.S. Cl.
CPC .... *H03M 13/1148* (2013.01); *H03M 13/1105* (2013.01); *H03M 13/116* (2013.01);
(Continued)

(58) Field of Classification Search
CPC ........... H03M 13/1148; H03M 13/118; H03M 13/6306; H03M 13/6393; H03M 13/116; H03M 13/1105
See application file for complete search history.

(56) References Cited

U.S. PATENT DOCUMENTS 7,904,792 B2  3/2011 Kim et al.
7,954,033 B2  5/2011 Hong et al.
(Continued)

FOREIGN PATENT DOCUMENTS

CN  1953335 A   4/2007
CN  101141133 A  3/2008
(Continued)

OTHER PUBLICATIONS

S. X. Wu and W. H. Mow, "Efficient Ranking of Rate-Compatible Puncturing Patterns for a Given LDPC Code Matrix," GLOBECOM 2009-2009 IEEE Global Telecommunications Conference, Honolulu, HI, 2009, pp. 1-6. (Year: 2009).*
(Continued)

*Primary Examiner* — Cynthia Britt
(74) *Attorney, Agent, or Firm* — Kilpatrick Townsend & Stockton LLP

(57) ABSTRACT

The present disclosure relates to a communications field, and discloses a method for generating a base matrix of an LDPC code, an encoding/decoding method, and a device, to resolve a problem that a probability of a decoding error increases because performance of a transformed check matrix cannot be ensured due to a poor puncturing pattern. A specific solution is as follows: A size of a check bit part of a base matrix is determined based on a required minimum bit rate, and the check bit part of the base matrix is determined based on the size of the check bit part and an initial matrix. The initial matrix is a matrix with a size of m×m that has a bidiagonal structure, the check bit part is a k-order transformation matrix $H_k$ obtained after the initial matrix is transformed k times, k meets $2^{k-1}m < T \leq 2^k m$, and T is the size of the check bit part. An information bit part of the base matrix is determined based on the check bit part, and the base matrix is obtained based on the check bit part
(Continued)

and the information bit part. The present disclosure is used in an encoding/decoding process.

7 Claims, 17 Drawing Sheets

(52) U.S. Cl.
CPC ..... *H03M 13/118* (2013.01); *H03M 13/6306* (2013.01); *H03M 13/6393* (2013.01)

(56) References Cited

U.S. PATENT DOCUMENTS

| | | |
|---|---|---|
| 8,006,162 B2 | 8/2011 | Choi et al. |
| 2007/0011567 A1 | 1/2007 | Choi et al. |
| 2012/0210189 A1 | 8/2012 | Sugihara et al. |
| 2017/0201348 A1* | 7/2017 | Jang .................. H03M 13/1148 |
| 2017/0359148 A1* | 12/2017 | Richardson ......... H03M 13/036 |

FOREIGN PATENT DOCUMENTS

| | | |
|---|---|---|
| CN | 104333390 A | 2/2015 |
| CN | 103053116 B | 10/2016 |

OTHER PUBLICATIONS

H. Zhou, D. G. M. Mitchell, N. Goertz and D. J. Costello, "Robust Rate-Compatible Punctured LDPC Convolutional Codes," in IEEE Transactions on Communications, vol. 61, No. 11, pp. 4428-4439, Nov. 2013. (Year: 2013).*

R. G. Gallager, "Low-Density Parity-Check Codes", IRE Transactions on Information Theory, 1962, pp. 21-28.

Jeongseok Ha et al., "Rate-Compatible Punctured Low-Density Parity-Check Codes With Short Block Lengths", IEEE Transactions on Information Theory, vol. 52, No. 2, Feb. 2006, pp. 728-738.

Jaehong Kim et al., "The design of Efficiently-Encodable Rate-Compatible LDPC Codes", IEEE Transactions on Communications, vol. 57, No. 2, Feb. 2009, pp. 365-375.

Valentin Savin, "Split-extended LDPC codes for coded cooperation", 2010 International Symposium on Information Theory and Its Applications, Oct. 17-20, 2010, total 10 pages.

"Text of ISO/IEC FDIS 23008-10 MMT FEC Codes", 109. MPEG Meeting;Jul. 7, 2014-Nov. 7, 2014;Sapporo;No. N14638,Sep. 25, 2014,total 38 pages.

Peiyao Zhao et al., "Construction of Multiple-Rate QC-LDPC Codes Using Hierarchical Row-Splitting", IEEE Communications Letters, vol. 20, No. 6, Jun. 2016,total 4 pages.

Gallager R G., "Low-density parity-check codes". Information Theory, IRE Transactions on, 1962, pp. 21-28.

Ha J, Kim J, Klinc D, et al., "Rate-compatible punctured low-density parity-check codes with short block lengths". Information Theory, IEEE Transactions on, 2006, pp. 728-738.

Kim J, Ramamoorthy A, McLaughlin S W., "The design of Efficiently-Encodable Rate-compatible LDPC codes", Communications; IEEE Transactions on, 2009, pp. 365-375.

* cited by examiner $$\begin{bmatrix} 1 & & & & & & & & & & & & & \\ & 1 & & & & & & & & & & & & \\ & & 1 & & & & & & & & & & & \\ & & & 1 & & & & & & & & & & \\ & & & & 1 & & & & & & & & & \\ & & & & & 1 & & & & & & & & \\ & & & & & & 1 & & & & & & & \\ & & & & & & & 1 & & & & & & \\ & & & & & & & & 1 & & & & & \\ & & & & & & & & & 1 & & & & \\ & & & & & & & & & & 1 & & & \\ & & & & & & & & & & & 1 & & \\ & & & & & & & & & & & & 1 & \\ & & & & & & & & & & & & & 1 \end{bmatrix} \xrightarrow{\text{Seven cyclic shifts to the right}} \begin{bmatrix} & & & & & & & 1 & & & & & & \\ & & & & & & & & 1 & & & & & \\ & & & & & & & & & 1 & & & & \\ & & & & & & & & & & 1 & & & \\ & & & & & & & & & & & 1 & & \\ & & & & & & & & & & & & 1 & \\ & & & & & & & & & & & & & 1 \\ 1 & & & & & & & & & & & & & \\ & 1 & & & & & & & & & & & & \\ & & 1 & & & & & & & & & & & \\ & & & 1 & & & & & & & & & & \\ & & & & 1 & & & & & & & & & \\ & & & & & 1 & & & & & & & & \\ & & & & & & 1 & & & & & & & \end{bmatrix}$$

FIG. 11

METHOD FOR GENERATING BASE MATRIX OF LDPC CODE, ENCODING/DECODING METHOD, AND DEVICE

CROSS-REFERENCE TO RELATED APPLICATIONS

This application is a continuation of International Application No. PCT/CN2016/096112 filed on Aug. 19, 2016, the disclosure of which is hereby incorporated by reference in its entirety.

TECHNICAL FIELD

Embodiments of the present application relate to the communications field, and in particular, to a method for generating a base matrix of an LDPC code, an encoding/decoding method, and a device.

BACKGROUND

Currently, in a wireless communications network having limited frequency resources, reliability and effectiveness of information transmission on a channel affect quality of service of the wireless communications network. A low-density parity-check (LDPC) code is a linear block code having a sparse check matrix. Because the low-density parity-check code has advantages such as low complexity, a low error flow, and supporting full parallel decoding, the low-density parity-check code is widely applied to channel encoding in the field such as Worldwide Interoperability for Microwave Access (Wimax), an optical network, and Wireless Fidelity (Wi-Fi), so as to ensure reliability and effectiveness of information transmitted on a channel.

It is well known that because a channel environment is complex and variable, during channel encoding, a codeword needs to be retransmitted by using a hybrid automatic repeat request (HARQ) technology, so as to improve performance of a communications system. The HARQ technology includes two solutions: chase combining (CC) and incremental redundancy (IR). In the CC solution, retransmitted data is completely the same as initially transmitted data, and there is only one redundancy version. A receive end performs soft combination on the retransmitted data and the initially transmitted data, and then decodes data obtained after the soft combination. In the IR solution, each retransmission includes different incremental redundancy check bits. When performing decoding, the receive end first combines codewords received for two times, and then decodes, as a codeword with a lower bit rate, a codeword obtained after the combination. Because both an energy gain and an encoding gain can be obtained in the IR solution, the IR solution is used to implement HARQ in most actual use.

When HARQ is implemented by using the IR solution, a transmit end may adjust a bit rate of an LDPC code through puncturing, and send a punctured LDPC code to the receive end, to adapt to different channel environments. Correspondingly, when decoding the received punctured LDPC code, the receive end first needs to set confidence of a punctured bit to 0, and then decode the LDPC code. However, in this decoding method, disadvantages such as high computational complexity, a slow convergence speed, and decoding performance deterioration occur. To resolve this problem, a decoding method is provided in the prior art. A specific solution of the decoding method is as follows: After receiving an LDPC code, the receive end first determines whether the LDPC code is a punctured codeword, and if the LDPC code is a punctured codeword, the receive end needs to perform transformation operations, that is, row combination and column deletion, on an initial check matrix (the transmit end performs encoding by using the initial check matrix), to obtain a transformed check matrix (a column deleted in a process of transforming the initial check matrix corresponds to a location of a punctured bit in the entire codeword. A bit rate of the transformed check matrix is consistent with that of the received LDPC code). Then the receive end decodes the LDPC code based on the obtained transformed check matrix.

In the prior art, at least the following problems exist: In the prior art, when row combination and column deletion are performed on the initial check matrix, a corresponding transformation operation needs to be performed based on a puncturing pattern used when the transmit end performs puncturing, and quality of the puncturing pattern has a relatively large impact on performance of the transformed check matrix. In other words, if the transformation operation is performed on the initial check matrix based on a relatively poor puncturing pattern, performance of the transformed check matrix cannot be ensured, and consequently a probability of a decoding error increases.

SUMMARY

Embodiments of the present disclosure provide a method for generating a base matrix of an LDPC code, an encoding/decoding method, and a device, to resolve a problem that a probability of a decoding error increases because performance of a transformed check matrix cannot be ensured due to a poor puncturing pattern.

To achieve the foregoing objective, the embodiments of the present disclosure use the following technical solutions.

According to a first aspect of the embodiments of the present disclosure, a method for generating a base matrix of an LDPC code is provided, including:

first determining a size of a check bit part of a base matrix based on a required minimum bit rate, and determining the check bit part of the base matrix based on the determined size of the check bit part and an initial matrix, where the initial matrix is a matrix with a size of m×m that has a bidiagonal structure, the check bit part is a k-order transformation matrix $H_k$ obtained after the initial matrix is transformed k times, the k-order transformation matrix $H_k$ is a matrix with a size of $2^k m \times 2^k m$, k meets $2^{k-1} < T \leq 2^k m$, and T is the size of the check bit part; then determining an information bit part of the base matrix based on the check bit part; and finally obtaining the base matrix based on the determined check bit part and information bit part, where an $i^{th}$ transformation in the k transformations is specifically:

for an $a^{th}$ row of an (i−1)-order transformation matrix $H_{i-1}$, filling a $b^{th}$ location in a $(2a)^{th}$ row of a split matrix $S_i$ with a first non-negative element in the $a^{th}$ row, filling a $c^{th}$ location in a $(2a−1)^{th}$ row of the split matrix $S_i$ with a second non-negative element in the $a^{th}$ row, and filling a remaining location of the split matrix $S_i$ with an element −1, to obtain the split matrix $S_i$, where the split matrix $S_i$ is a matrix with a size of $2^i m \times 2^{i-1} m$, and i is an integer greater than 0 and less than or equal to k; when i=1, the (i−1)-order transformation matrix $H_{i-1}$ is the initial matrix; and the $a^{th}$ row is any row of the (i−1)-order transformation matrix $H_{i-1}$, b is a location that is of the first non-negative element in the $a^{th}$ row and that is in the $a^{th}$ row, c is a location that is of the second non-negative element in the $a^{th}$ row and that is in the $a^{th}$ row, and a, b, and c each are an integer greater than 0;

generating a supplementary matrix $A_i$ according to $$A_{d,e} = \begin{cases} 0 & (d, e) \in \{(d, e), d = e*2 - 0 \vee d = e*2 - 1\} \\ -1 & \text{others} \end{cases},$$

where $A_{d,e}$ represents an element in a $d^{th}$ row and an $e^{th}$ column of the supplementary matrix $A_i$, d is an integer greater than 0 and less than $2^i$m, and e is an integer greater than 0 and less than $2^{i-1}$m; and concatenating the split matrix $S_i$ and the supplementary matrix $A_i$ to obtain an i-order transformation matrix $H_i=[S_i, A_i]$.

In the method for generating a base matrix of an LDPC code provided in the embodiments of the present disclosure, first, the size of the check bit part of the base matrix is determined based on the required minimum bit rate, and the initial matrix is transformed k times based on the determined size of the check bit part, to obtain the check bit part of the base matrix; then the information bit part of the base matrix is determined based on the check bit part; and finally the base matrix is obtained based on the determined check bit part and information bit part. In this way, the generated base matrix has a fixed puncturing pattern, so as to ensure performance of a transformation matrix that is obtained by a receive end by transforming the base matrix based on the fixed puncturing pattern, thereby decreasing a probability of a decoding error.

According to a second aspect of the embodiments of the present disclosure, a decoding method is provided and is applied to a receive end, the base matrix according to the first aspect is preconfigured to the receive end, and the method may include the following steps: The receive end receives a to-be-initially-transmitted LDPC code sent by a transmit end at a preset initial transmission bit rate, and determines that the received to-be-initially-transmitted LDPC code includes a punctured bit. The receive end determines, based on a minimum bit rate and the initial transmission bit rate, a quantity x of columns that need to be deleted from a check bit part of the base matrix, and transforms the base matrix to obtain a first transformation matrix. The first transformation matrix is a matrix obtained after the x columns in the check bit part are deleted starting from a last column in the check bit part of the base matrix and rows corresponding to each column are combined when the column is deleted. Then the receive end decodes the to-be-initially-transmitted LDPC code by using the obtained first transformation matrix.

In the decoding method provided in the embodiments of the present disclosure, when determining that the to-be-initially-transmitted LDPC code sent by the transmit end includes a punctured bit, the receive end first determines, based on the minimum bit rate and the initial transmission bit rate, the quantity x of columns that need to be deleted from the check bit part of the base matrix; then deletes the x columns starting from the last column in the check bit part of the base matrix, and combines the rows corresponding to each row when the row is deleted, to obtain the first transformation matrix whose bit rate is equal to the initial transmission bit rate; and finally decodes the to-be-initially-transmitted LDPC code by using the obtained first transformation matrix. The receive end obtains a transformation matrix by transforming the base matrix based on a fixed puncturing pattern, that is, transforming the base matrix in a manner in which the receive end deletes, starting from the last column in the check bit part of the base matrix, a corresponding quantity of columns from the check bit part of the base matrix based on x, and combines rows corresponding to each column when the column is deleted, so that performance of the transformation matrix is ensured, thereby decreasing a probability of a decoding error.

With reference to the second aspect, in a possible implementation, for each column in the check bit part of the base matrix, the receive end pre-stores a correspondence between the column and a row corresponding to the column, where a $(2^i m)^{th}$ column in the check bit part corresponds to each of a $(2^k m)^{th}$ row, a $(2^k m-1)^{th}$ row, a $(2^k m-2)^{th}$ row, ..., and $(2^k m-2^{k-j+1}+1)^{th}$ row of the base matrix;

a $(2^i m-1)^{th}$ column in the check bit part corresponds to each of a $(2^k m-2^{k-j+1})^{th}$ row, a $(2^k m-2^{k-j+1}-1)^{th}$ row, a $(2^k m-2^{k-j+1}-2)^{th}$ row, ..., and a $(2^k m-2^{k-j+2})^{th}$ row of the base matrix; and by analogy, a $(2^{j-1}+1)^{th}$ column in the check bit part corresponds to each of a $(2^{k-j+1})^{th}$ row, ..., a second row, and a first row of the base matrix, where j is an integer greater than 0 and less than k.

With reference to the second aspect and the foregoing possible implementation, in another possible implementation, the decoding method may further include the following steps: If the receive end determines that the received to-be-initially-transmitted LDPC code sent by the transmit end includes no punctured bit, the receive end may first combine soft values of repeated bits that may exist, and then decode the to-be-initially-transmitted LDPC code by directly using the preconfigured base matrix without performing any transformation on the pre-configured base matrix.

In addition, after decoding the to-be-initially-transmitted LDPC code by using the preconfigured base matrix, the receive end may determine whether decoding on the to-be-initially-transmitted LDPC code succeeds. If the receive end determines that decoding on the to-be-initially-transmitted LDPC code succeeds, the receive end sends an acknowledgement (ACK) instruction to the transmit end, to complete current data transmission. Alternatively, if the receive end determines that decoding on the to-be-initially-transmitted LDPC code fails, the receive end sends a negative acknowledgement (NACK) instruction to the transmit end, so that the transmit end performs retransmission until decoding performed by the receive end succeeds or a quantity of retransmissions reaches a preset threshold.

With reference to the second aspect and the foregoing possible implementations, in another possible implementation, after the receive end decodes the to-be-initially-transmitted LDPC code by using the first transformation matrix, the decoding method may further include the following steps: The receive end determines whether decoding on the to-be-initially-transmitted LDPC code succeeds. If the receive end determines that decoding on the to-be-initially-transmitted LDPC code succeeds, the receive end sends an ACK instruction to the transmit end, to complete current data transmission. Alternatively, if the receive end determines that decoding on the to-be-initially-transmitted LDPC code fails, the receive end sends a NACK instruction to the transmit end, so that the transmit end constructs to-be-retransmitted bits based on the NACK instruction, and sends the to-be-retransmitted bits based on the NACK instruction. In this case, the receive end receives the to-be-retransmitted bits sent by the transmit end, and needs to first determine whether a retransmission bit rate is greater than the minimum bit rate. If the retransmission bit rate is greater than the minimum bit rate, it indicates that a first LDPC code obtained after the received to-be-retransmitted bits and all bits included in the to-be-initially-transmitted LDPC code are concatenated still includes a punctured bit. In this case, the receive end may directly concatenate the to-be-retransmitted bits and all the bits included in the to-be-initially-transmitted LDPC code, to obtain the first LDPC code whose bit rate is equal to the retransmission bit rate. Then the receive end determines, based on the minimum bit rate and the retransmission bit rate, a quantity y of columns that need to be deleted from the check bit part of the base matrix, and transforms the base matrix to obtain a second transformation matrix. The second transformation matrix is a matrix obtained after the y columns in the check bit part are deleted starting from the last column in the check bit part of the base matrix and rows corresponding to each column are combined when the column is deleted; and a bit rate of the second transformation matrix is equal to the retransmission bit rate. Finally, the receive end decodes the first LDPC code by using the second transformation matrix.

Alternatively, if the retransmission bit rate is less than the minimum bit rate, it indicates that the to-be-retransmitted bits include a bit repeated with a bit included in the to-be-initially-transmitted LDPC code. In this case, the receive end may first combine the to-be-retransmitted bits and a soft value that is in the bit included in the to-be-initially-transmitted LDPC code and that represents a same bit; and then concatenate bits obtained after the combination and a remaining bit, to obtain a first LDPC code, and decode the first LDPC code by directly using the base matrix.

Alternatively, if the retransmission bit rate is equal to the minimum bit rate, the receive end may directly concatenate the to-be-retransmitted bits and all bits included in the to-be-initially-transmitted LDPC code, to obtain a first LDPC code, and then decode the first LDPC code by directly using the base matrix.

Certainly, after decoding the first LDPC code, the receive end further needs to determine whether decoding on the first LDPC code succeeds. When determining that decoding succeeds, the receive end sends an ACK instruction to the transmit end, to complete current data transmission. Alternatively, when determining that decoding fails, the receive end sends a NACK instruction to the transmit end, so that the transmit end can re-construct and send first to-be-retransmitted bits to the receive end. In this case, after receiving the first to-be-retransmitted bits, the receive end needs to combine all retransmitted to-be-retransmitted bits and all bits in the initial LDPC code that is received for the first time, to construct a second LDPC code. Current data transmission is not completed until decoding on an LDPC code succeeds or a quantity of retransmissions reaches a preset threshold.

According to a third aspect of the embodiments of the present disclosure, an encoding method is provided and is applied to a transmit end, the base matrix according to the first aspect is preconfigured for the transmit end, and the method may include the following steps: The transmit end encodes to-be-transmitted information by using the base matrix, to obtain an LDPC code, and determines whether a preset initial transmission bit rate is greater than a minimum bit rate. If the transmit end determines that the initial transmission bit rate is greater than the minimum bit rate, the transmit end determines, based on the initial transmission bit rate and the minimum bit rate, a quantity of bits that need to be punctured; then punctures the LDPC code from a last bit of the LDPC code based on the quantity of bits that need to be punctured, to generate a to-be-initially-transmitted LDPC code; and finally sends the to-be-initially-transmitted LDPC code to a receive end at the initial transmission bit rate.

Alternatively, if the transmit end determines that the initial transmission bit rate is less than the minimum bit rate, the transmit end determines, based on the initial transmission bit rate and the minimum bit rate, a quantity of bits that need to be repeated; and then repeats, from a first bit one by one, bits of the LDPC code obtained through encoding, and adds repeated bits to the LDPC code, to generate a to-be-initially-transmitted LDPC code; and sends the to-be-initially-transmitted LDPC code to a receive end at the initial transmission bit rate. Alternatively, if the transmit end determines that the initial transmission bit rate is equal to the minimum bit rate, the transmit end directly uses the LDPC code obtained through encoding as a to-be-initially-transmitted LDPC code, and sends the to-be-initially-transmitted LDPC code to a receive end at the initial transmission bit rate. In addition, if the initial transmission bit rate is less than or equal to the minimum bit rate, after the transmit end sends the to-be-initially-transmitted LDPC code to the receive end, if the transmit end receives an ACK instruction sent by the receive end, it indicates that decoding on the to-be-initially-transmitted LDPC code performed by the receive end succeeds, and data transmission is completed in this case. Alternatively, if the transmit end receives a NACK instruction sent by the receive end, it indicates that decoding on the to-be-initially-transmitted LDPC code performed by the receive end fails. In this case, the transmit end needs to perform retransmission until receiving an ACK instruction sent by the receive end or a quantity of retransmissions reaches a preset threshold.

In the encoding method provided in the embodiments of the present disclosure, the transmit end encodes the to-be-transmitted information by using the base matrix, to obtain the LDPC code. If the transmit end determines that the initial transmission bit rate is greater than the minimum bit rate, the transmit end determines, based on the initial transmission bit rate and the minimum bit rate, the quantity of bits that need to be punctured; then punctures the LDPC code from the last bit of the LDPC code based on the quantity of bits that need to be punctured, to generate the to-be-initially-transmitted LDPC code; and finally sends the to-be-initially-transmitted LDPC code to the receive end at the initial transmission bit rate. The LDPC code is punctured from the last bit of the LDPC code to generate the to-be-initially-transmitted LDPC code. Therefore, the receive end may obtain a transformation matrix by transforming the base matrix based on a fixed puncturing pattern, that is, transforming the base matrix in a manner in which the receive end deletes, starting from the last column in the check bit part of the base matrix, a corresponding quantity of columns from the check bit part of the base matrix based on x, and combines rows corresponding to each column when the column is deleted, so that performance of the transformation matrix is ensured, thereby decreasing a probability of a decoding error.

With reference to the third aspect and the foregoing possible implementation, in another possible implementation, after the transmit end sends the to-be-initially-transmitted LDPC code to the receive end at the initial transmission bit rate, the encoding method may further include the following steps: If the transmit end receives a NACK instruction sent by the receive end, it indicates that decoding on the to-be-initially-transmitted LDPC code performed by the receive end fails. In this case, the transmit end may generate to-be-retransmitted bits based on a preset retransmission bit rate, and send the to-be-retransmitted bits to the receive end. The to-be-retransmitted bits include some or all punctured bits, or the to-be-retransmitted bits include all punctured bits and bits obtained by repeating bits of the LDPC code one by one from the first bit.

In addition, if the transmit end receives an ACK instruction sent by the receive end, it indicates that decoding on the to-be-initially-transmitted LDPC code performed by the receive end succeeds, and current data transmission is completed.

With reference to the third aspect and the foregoing possible implementations, in another possible implementation, the method further includes the following steps: If the transmit end receives again the NACK instruction sent by the receive end, the transmit end may re-generate first to-be-retransmitted bits, and send the first to-be-retransmitted bits to the receive end until receiving the ACK instruction sent by the receive end or the quantity of retransmissions reaches the preset threshold.

According to a fourth aspect of the embodiments of the present disclosure, a device for generating a base matrix of an LDPC code is provided, including:

a determining unit, configured to: determine a size of a check bit part of a base matrix based on a required minimum bit rate; determine the check bit part of the base matrix based on the size of the check bit part and an initial matrix, where the initial matrix is a matrix with a size of m×m that has a bidiagonal structure, the check bit part is a k-order transformation matrix $H_k$ obtained after the initial matrix is transformed k times, the k-order transformation matrix $H_k$ is a matrix with a size of $2^k m \times 2^k m$ k meets $2^{k-1}m < T \leq 2^k m$, and T is the size of the check bit part; and determine an information bit part of the base matrix based on the check bit part; and a processing unit, configured to obtain the base matrix based on the check bit part and the information bit part that are determined by the determining unit; where for an $i^{th}$ transformation in the k transformations, the determining unit is specifically configured to:

for an $a^{th}$ row of an (i−1)-order transformation matrix $H_{i-1}$, fill a $b^{th}$ location in a $(2a)^{th}$ row of a split matrix $S_i$ with a first non-negative element in the $a^{th}$ row, fill a $c^{th}$ location in a $(2a-1)^{th}$ row of the split matrix $S_i$ with a second non-negative element in the $a^{th}$ row, and fill a remaining location of the split matrix $S_i$ with an element −1, to obtain the split matrix $S_i$, where the split matrix $S_i$ is a matrix with a size of $2^i m \times 2^{i-1} m$, and i is an integer greater than 0 and less than or equal to k; when i=1, the (i−1)-order transformation matrix $H_{i-1}$ is the initial matrix; and the $a^{th}$ row is any row of the (i−1)-order transformation matrix $H_{i-1}$, b is a location that is of the first non-negative element in the $a^{th}$ row and that is in the $a^{th}$ row, c is a location that is of the second non-negative element in the $a^{th}$ row and that is in the $a^{th}$ row, and a, b, and c each are an integer greater than 0;

generate a supplementary matrix $A_i$ according to $$A_{d,e} = \begin{cases} 0 & (d,e) \in \{(d,e), d = e*2-0 \vee d = e*2-1\} \\ -1 & \text{others} \end{cases},$$

others where $A_{d,e}$ represents an element in a $d^{th}$ row and an $e^{th}$ column of the supplementary matrix $A_i$, d is an integer greater than 0 and less than $2^i m$, and e is an integer greater than 0 and less than $2^{i-1}m$; and concatenate the split matrix $S_i$ and the supplementary matrix $A_i$ to obtain an i-order transformation matrix $H_i = [S_i, A_i]$.

According to a fifth aspect of the embodiments of the present disclosure, a receive end is provided, the base matrix according to the first aspect is preconfigured for the receive end, and the receive end includes:

a receiving unit, configured to receive a to-be-initially-transmitted LDPC code sent by a transmit end at a preset initial transmission bit rate;

a determining unit, configured to: determine that the to-be-initially-transmitted LDPC code received by the receiving unit includes a punctured bit; and determine, based on the minimum bit rate and the initial transmission bit rate, a quantity x of columns that need to be deleted from a check bit part of the base matrix;

a transformation unit, configured to transform the base matrix to obtain a first transformation matrix, where a bit rate of the first transformation matrix is equal to the initial transmission bit rate, and the first transformation matrix is a matrix obtained after the x columns in the check bit part are deleted starting from a last column in the check bit part of the base matrix and rows corresponding to each column are combined when the column is deleted; and a decoding unit, configured to decode the to-be-initially-transmitted LDPC code by using the first transformation matrix that is obtained by the transformation unit through a transformation.

With reference to the fifth aspect, in a possible implementation, the receive end further includes a storage unit; and for each column in the check bit part of the base matrix, the storage unit pre-stores a correspondence between the column and a row corresponding to the column; where a $(2^j m)^{th}$ column in the check bit part corresponds to each of a $(2^k m)^{th}$ row, a $(2^k m-1)^{th}$ row, a $(2^k m-2)^{th}$ row, ..., and a $(2^k m - 2^{k-j+1}+1)^{th}$ row of the base matrix;

a $(2^j m-1)^{th}$ column in the check bit part corresponds to each of a $(2^k m-2^{k-j+1})^{th}$ row, a $(2^k m-2^{k-j+1}-1)^{th}$ row, a $(2^k m-2^{k-j+1}-2)^{th}$ row, ..., and a $(2^k m-2^{k-j+2})^{th}$ row of the base matrix; and by analogy, a $(2^{j-1}+1)^{th}$ column in the check bit part corresponds to each of a $(2^{k-j+1})^{th}$ row, ..., a second row, and a first row of the base matrix, where j is an integer greater than 0 and less than k.

With reference to the fifth aspect and the foregoing possible implementation, in another possible implementation, the receive end further includes a sending unit and a combination unit, where the determining unit is further configured to determine that decoding on the to-be-initially-transmitted LDPC code performed by the decoding unit fails;

the sending unit is configured to send a negative acknowledgement NACK instruction to the transmit end; and the receiving unit is further configured to receive to-be-retransmitted bits sent by the transmit end; and a concatenating unit, configured to: if a retransmission bit rate is greater than the minimum bit rate, concatenate the to-be-retransmitted bits received by the receiving unit and all bits included in the to-be-initially-transmitted LDPC code, to obtain a first LDPC code, where a bit rate of the first LDPC code is equal to the retransmission bit rate, where the determining unit is further configured to determine, based on the minimum bit rate and the retransmission bit rate, a quantity y of columns that need to be deleted from the check bit part of the base matrix;

the transformation unit is further configured to transform the base matrix to obtain a second transformation matrix, where the second transformation matrix is a matrix obtained after the y columns in the check bit part are deleted starting from the last column in the check bit part of the base matrix and rows corresponding to each column are combined when the column is deleted; and a bit rate of the second transformation matrix is equal to the retransmission bit rate; and the decoding unit is further configured to decode the first LDPC code by using the second transformation matrix that is obtained by the transformation unit through a transformation.

For a specific implementation, refer to behavior functions of the receive end in the decoding method provided in the second aspect or the possible implementations of the second aspect. Details are not described herein again.

According to a sixth aspect of the embodiments of the present disclosure, a transmit end is provided, the base matrix according to the first aspect is preconfigured for the transmit end, and the transmit end includes:

an encoding unit, configured to encode to-be-transmitted information by using the base matrix, to obtain an LDPC code;

a determining unit, configured to: if a preset initial transmission bit rate is greater than the minimum bit rate, determine, based on the initial transmission bit rate and the minimum bit rate, a quantity of bits that need to be punctured;

a puncturing unit, configured to puncture, based on the quantity that is of bits that need to be punctured and that is determined by the determining unit, the LDPC code from a last bit of the LDPC code obtained by the encoding unit through encoding, to generate a to-be-initially-transmitted LDPC code; and a sending unit, configured to send the to-be-initially-transmitted LDPC code to a receive end at the initial transmission bit rate.

With reference to the sixth aspect, in a possible implementation, the transmit end further includes a receiving unit and a generation unit, where the receiving unit is configured to receive a negative acknowledgement NACK instruction sent by the receive end;

the generation unit is configured to: in response to the NACK instruction received by the receiving unit, generate to-be-retransmitted bits based on a preset retransmission bit rate, where the to-be-retransmitted bits include some or all punctured bits, or the to-be-retransmitted bits include all punctured bits and bits obtained by repeating bits of the LDPC code one by one from a first bit; and the sending unit is further configured to send, to the receive end, the to-be-retransmitted bits generated by the generation unit.

With reference to the sixth aspect and the foregoing possible implementation, in another possible implementation, the generation unit is further configured to: if the NACK instruction sent by the receive end is received again, re-generate first to-be-retransmitted bits; and the sending unit is further configured to send, to the receive end, the first to-be-retransmitted bits generated by the generation unit, until an acknowledgement ACK instruction sent by the receive end is received or a quantity of retransmissions reaches a preset threshold.

For a specific implementation, refer to behavior functions of the transmit end in the encoding method provided in the third aspect or the possible implementations of the third aspect. Details are not described herein again.

According to a seventh aspect of the embodiments of the present disclosure, a device for generating a base matrix of an LDPC code is provided, including: at least one processor, a memory, a system bus, and a communications interface, where the memory is configured to store a computer execution instruction; the processor and the memory are connected by using the system bus; and when the device for generating a base matrix of an LDPC code runs, the processor executes the computer execution instruction stored in the memory, so that the device for generating a base matrix of an LDPC code performs the method for generating a base matrix of an LDPC code according to the first aspect.

According to an eighth aspect of the embodiments of the present disclosure, a receive end is provided, the base matrix according to the first aspect is preconfigured for the receive end, and the receive end includes: at least one processor, a memory, a system bus, and a communications interface, where the memory is configured to store a computer execution instruction; the processor and the memory are connected by using the system bus; and when the receive end runs, the processor executes the computer execution instruction stored in the memory, so that the receive end performs the decoding method according to any one of the second aspect or the possible implementations of the second aspect.

According to a ninth aspect of the embodiments of the present disclosure, a transmit end is provided, the base matrix according to the first aspect is preconfigured for the transmit end, and the transmit end includes: at least one processor, a memory, a system bus, and a communications interface, where the memory is configured to store a computer execution instruction; the processor and the memory are connected by using the system bus; and when the transmit end runs, the processor executes the computer execution instruction stored in the memory, so that the transmit end performs the encoding method according to any one of the third aspect or the possible implementations of the third aspect.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

FIG. 11 is a schematic diagram of an identity matrix and a permutation matrix according to an embodiment of the present disclosure;

DETAILED DESCRIPTION

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Because quality of a puncturing pattern has a relatively large impact on performance of a transformed check matrix, the embodiments of the present disclosure provide a method for generating a base matrix of an LDPC code, to decrease a probability of a decoding error. A principle of the method is as follows: A device for generating a base matrix of an LDPC code determines a size of a check bit part of a base matrix based on a required minimum bit rate, and determines the check bit part of the base matrix based on the determined size of the check bit part and an initial matrix. The initial matrix is a matrix with a size of m×m that has a bidiagonal structure, the check bit part is a k-order transformation matrix $H_k$ obtained after the initial matrix is transformed k times, the k-order transformation matrix $H_k$ is a matrix with a size of $2^k m \times 2^k m$, k meets $2^{k-1}m < T \leq 2^k m$, and T is the size of the check bit part. Then the device determines an information bit part of the base matrix based on the check bit part. Finally, the device can determine the base matrix based on the determined check bit part and information bit part. In this way, the generated base matrix has a fixed puncturing pattern, so as to ensure performance of a transformation matrix obtained by a receive end by transforming the base matrix based on the fixed puncturing pattern, thereby decreasing a probability of a decoding error.

The following describes the embodiments of the present disclosure in detail with reference to the accompanying drawings.

Currently, a transmit end and a receive end may exchange information by using a wireless communications technology through a radio channel. The transmit end may encode and modulate to-be-transmitted information that needs to be transmitted, to obtain a transmit signaling suitable to transmit through a radio channel, and send the transmit signal to the receive end. The receive end receives the receive signal transmitted through the radio channel, and then demodulates and decodes the receive signal to obtain the to-be-transmitted information that needs to be transmitted by the transmit end. The to-be-transmitted information may be a symbol, such as a text or a language; or may be a signal, such as an image or a sound. The transmit end may be user equipment (UE) or a base station. The receive end may be UE or a base station.

Figure 1:
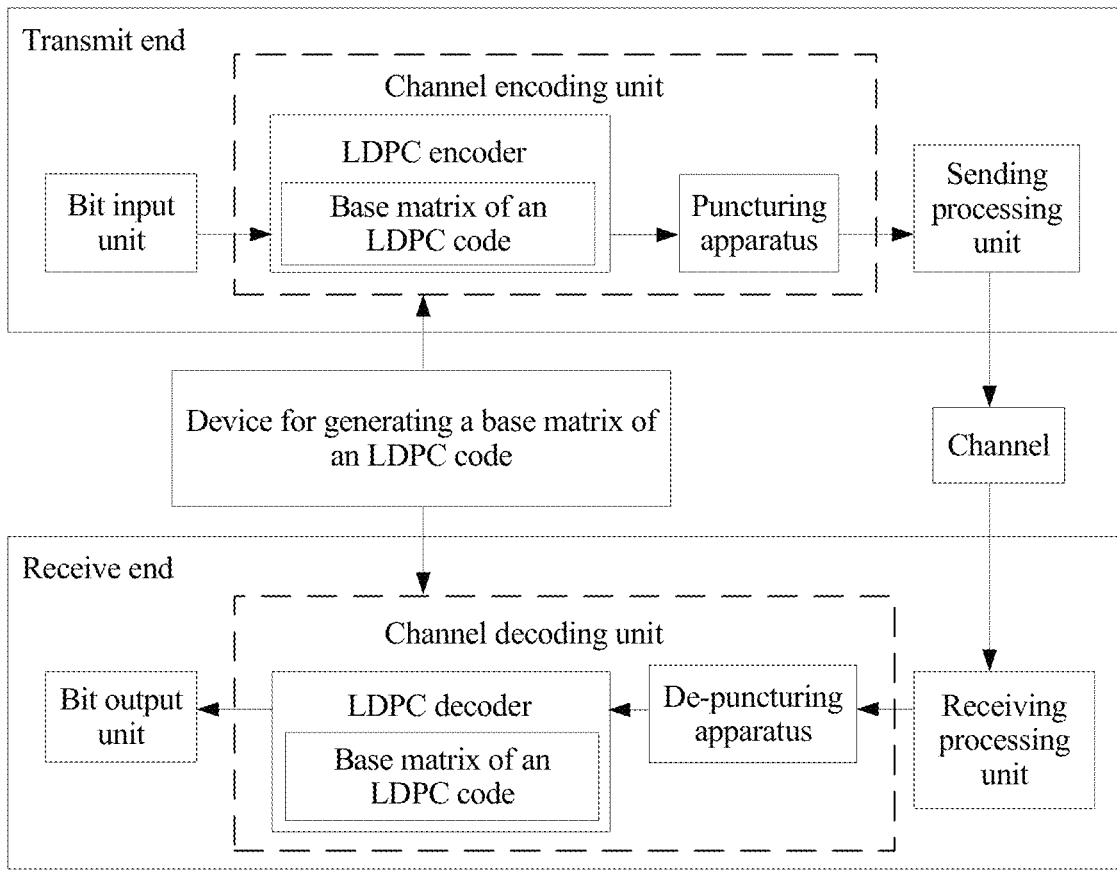
FIG. 1 is a simplified schematic diagram of a wireless communications system to which an embodiment of the present disclosure is applied according to an embodiment of the present disclosure.

As shown in FIG. 1, FIG. 1 is a simplified schematic diagram of a wireless communications system to which an embodiment of the present disclosure may be applied. The wireless communications system may include a bit input unit, a channel encoding unit, a sending processing unit, a channel, a receiving processing unit, a channel decoding unit, and a bit output unit. The channel encoding unit includes an LDPC encoder and a puncturing apparatus. The channel decoding unit includes an LDPC decoder and a de-puncturing apparatus. The sending processing unit includes some devices, such as modulators, that need to process to-be-transmitted bit information. The receiving processing unit includes some devices, such as demodulators, that need to process received transmitted bit information.

The bit input unit is configured to obtain to-be-transmitted information that needs to be transmitted. The LDPC encoder stores a base matrix of an LDPC code, and is configured to perform LDPC encoding on the to-be-transmitted information that needs to be transmitted and that is generated by an information source, to obtain an LDPC code. The puncturing apparatus is configured to puncture the LDPC code to obtain an LDPC code having an expected bit rate. The modulator is configured to modulate the LDPC code obtained through puncturing performed by the puncturing apparatus, to obtain a signal suitable for channel transmission. The channel is configured to transmit the signal to an information sink. The demodulator is configured to demodulate the signal transmitted through the channel. The de-puncturing apparatus is configured to de-puncture the punctured LDPC code. The LDPC decoder stores a base matrix of an LDPC code, and is configured to perform LDPC decoding on a signal obtained through demodulation performed by the demodulator, to obtain the to-be-transmitted information that needs to be transmitted. The bit output unit is configured to output to-be-transmitted information.

A transmit end may include the bit input unit, the channel encoding unit, and the sending processing unit. A receive end may include the receiving processing unit, the channel decoding unit, and the bit output unit.

Further, the wireless communications system may include a device for generating a base matrix of an LDPC code. The device for generating a base matrix of an LDPC code is configured to generate a base matrix of an LDPC code.

Figure 2:
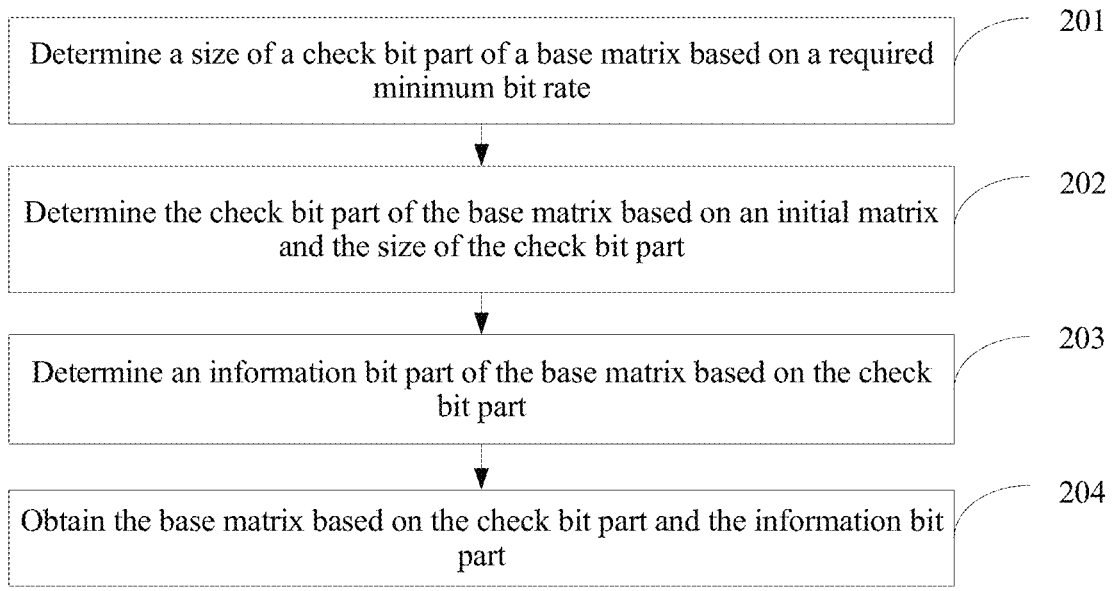
FIG. 2 is a flowchart of a method for generating a base matrix of an LDPC code according to an embodiment of the present disclosure.

FIG. 2 is a flowchart of a method for generating a base matrix of an LDPC code according to an embodiment of the present disclosure. As shown in FIG. 2, the method may include the following steps.

It should be noted that a device that performs the method for generating a base matrix of an LDPC code in this embodiment of the present disclosure may be an electronic device such as a computer. In addition, it may be known that a base matrix of an LDPC code may be extended to obtain a check matrix of the LDPC code, and the LDPC code may be uniquely determined based on the check matrix of the LDPC code. The base matrix of the LDPC code includes an information bit part and a check bit part. In this embodiment of the present disclosure, a base matrix of an LDPC code is generated by using the following steps:

201. Determine a size of a check bit part of a base matrix based on a required minimum bit rate.

The minimum bit rate is preset according to a requirement in an actual application scenario. A bit rate is equal to a ratio of a quantity of information bits included in an LDPC code to a total quantity of bits of the LDPC code, and the LDPC code is obtained by encoding to-be-transmitted information based on the base matrix. Assuming that an extension factor used when the base matrix is extended to obtain a check matrix is z, a quantity of information bits and check bits included in an LDPC code that is obtained by encoding the to-be-transmitted information by using the check matrix corresponding to the base matrix is equal to a product of the extension factor and a length of the base matrix, and a quantity of information bits included in the obtained LDPC code is equal to the extension factor multiplied by a difference between the length and a width of the base matrix. Therefore, the bit rate may be determined based on the length and the width of the base matrix. In addition, the check bit part of the base matrix is a square matrix, and therefore the size of the check bit part of the base matrix may be determined based on a preset minimum bit rate.

202. Determine the check bit part of the base matrix based on an initial matrix and the size of the check bit part.

Figure 3:
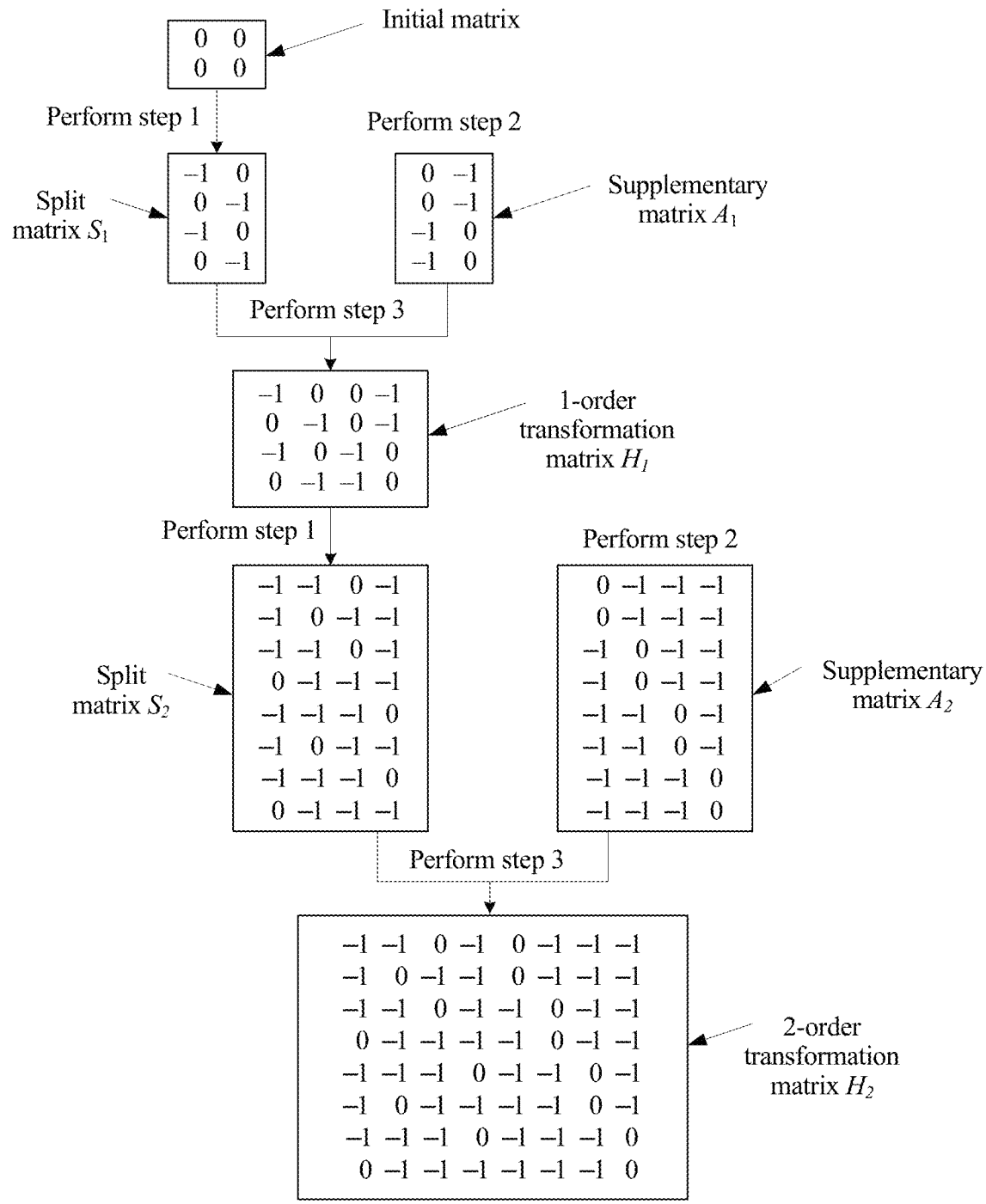
FIG. 3 is a schematic diagram of an initial matrix transformation according to an embodiment of the present disclosure.
Figure 4:
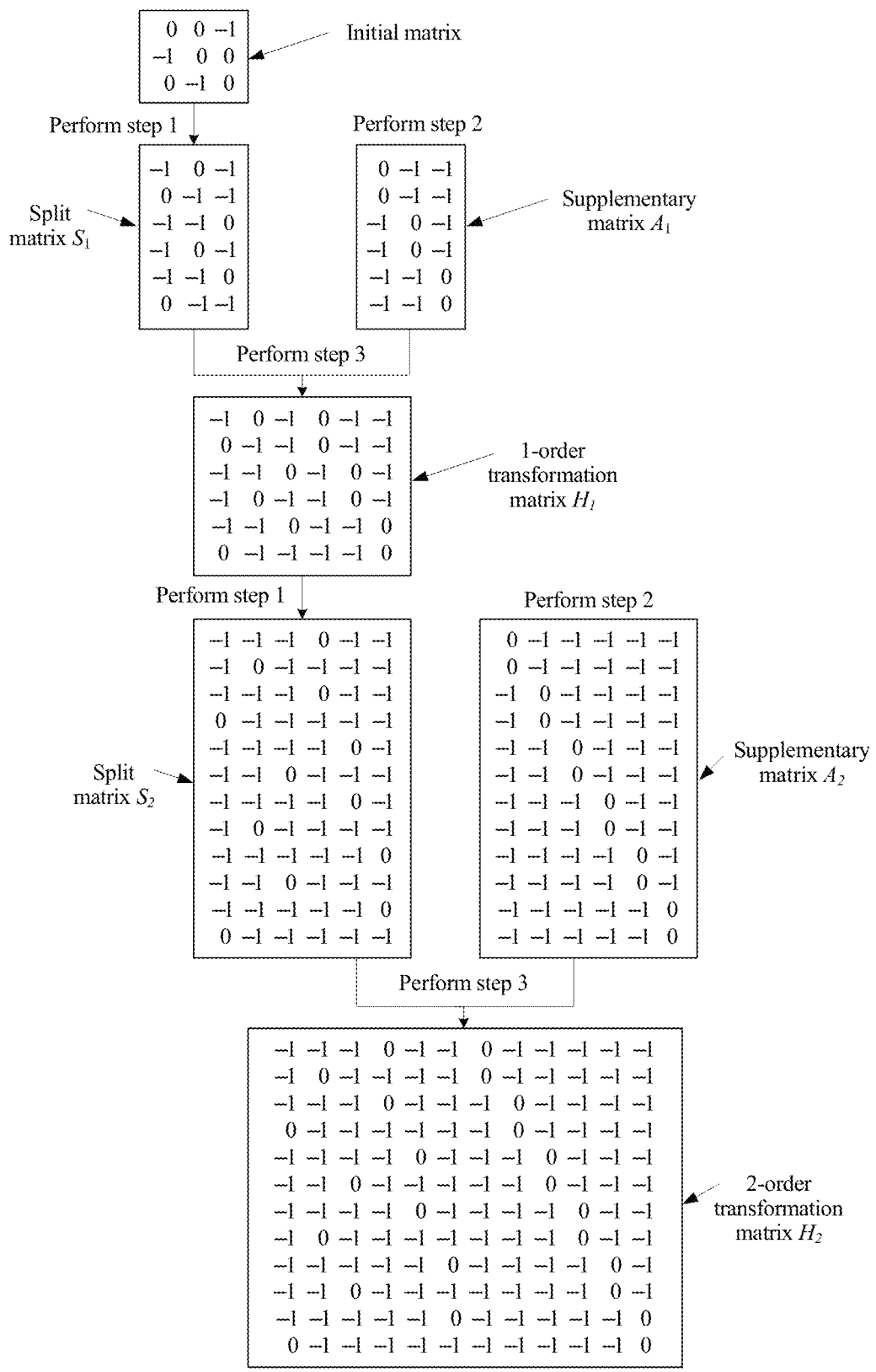
FIG. 4 is a schematic diagram of another initial matrix transformation according to an embodiment of the present disclosure.

The initial matrix is a matrix with a size of m×m that has a bidiagonal structure. A row weight (the row weight is a quantity of elements that are greater than or equal to 0 in a row of the matrix) and a column weight of the initial matrix (the column weight is a quantity of elements that are greater than or equal to 0 in a column of the matrix) each are 2. For example, m may be usually set to 2 or 3. Certainly, m may also be set to another value, provided that the initial matrix is a square matrix having a bidiagonal structure. A value of m is not specifically limited in this embodiment of the present disclosure. For example, when m=2, the initial matrix is a 2×2 square matrix. As shown in FIG. 3, all elements of the initial matrix are 0. For another example, when m=3, the initial matrix is a 3×3 square matrix. As shown in FIG. 4, the initial matrix meets a requirement of a bidiagonal structure.

When a size of the initial matrix is known, a quantity k of transformations that are required to transform the initial matrix into the check bit part of the base matrix may be further determined based on the size of the check bit part. For example, assuming that it is known that the size of the check bit part is T×T, the size of the initial matrix is m×m, and the quantity k of transformations is a positive integer, it is found that k meets the following formula:

$$2^{k-1}m < T \leq 2^k m$$

When $T=2^k m$, a matrix obtained after the k transformations is a finally generated check bit part of the base matrix. When $T<2^k m$, a matrix is constructed based on the k transformations, and after the construction is completed, a row combination operation is performed on the matrix $2^k m - T$ times. In this way, an obtained finally generated check bit part of the base matrix meets the size of T×T.

After the quantity k of transformations that are required to transform the initial matrix into the check bit part of the base matrix is determined, the initial matrix may be transformed k times to obtain a k-order transformation matrix $H_k$, and the k-order transformation matrix $H_k$ is used as the check bit part of the base matrix. The k-order transformation matrix $H_k$ is a matrix with a size of $2^k m \times 2^k m$.

Specifically, an $i^{th}$ transformation in the k transformations is implemented by performing the following steps:

Step 1: For an $a^{th}$ row of an (i−1)-order transformation matrix $H_{i-1}$, fill a $b^{th}$ location in a $(2a)^{th}$ row of a split matrix $S_i$ with a first non-negative element in the $a^{th}$ row, fill a $c^{th}$ location in a $(2a-1)^{th}$ row of the split matrix $S_i$ with a second non-negative element in the $a^{th}$ row, and fill a remaining location of the split matrix $S_i$ with an element −1, to obtain the split matrix $S_i$.

The split matrix $S_i$ is a matrix with a size of $2^i m \times 2^{i-1} m$, and i is an integer greater than 0 and less than or equal to k. When i=1, the (i−1)-order transformation matrix $H_{i-1}$ is the initial matrix. The $a^{th}$ row is any row of the (i−1)-order transformation matrix $H_{i-1}$, b is a location that is of the first non-negative element in the $a^{th}$ row and that is in the $a^{th}$ row, c is a location that is of the second non-negative element in the $a^{th}$ row and that is in the $a^{th}$ row, and a, b, and c each are an integer greater than 0.

For example, based on the initial matrix shown in FIG. 3, when step 1 is performed, during a first transformation, a first location in a second row of a split matrix $S_1$ is filled with a first non-negative element in a first row of the initial matrix, a second location in a first row of the split matrix $S_1$ is filled with a second non-negative element in the first row, a first location in a fourth row of the split matrix $S_1$ is filled with a first non-negative element in a second row of the initial matrix, a second location in a third row of the split matrix $S_1$ is filled with a second non-negative element in the second row, and a remaining location of the split matrix $S_1$ is filled with an element −1, to obtain the split matrix $S_1$ shown in FIG. 3. Likewise, during a second transformation, a second location in a second row of a split matrix $S_2$ is filled with a first non-negative element in a first row of a 1-order transformation matrix $H_1$ shown in FIG. 3, a third location in a first row of the split matrix $S_2$ is filled with a second non-negative element in the first row, a first location in a fourth row of the split matrix $S_2$ is filled with a first non-negative element in a second row of the 1-order transformation matrix $H_1$, a third location in a third row of the split matrix $S_1$ is filled with a second non-negative element in the second row, . . . , a first location in an eighth row of the split matrix $S_2$ is filled with a first non-negative element in a fourth row of the 1-order transformation matrix $H_1$, a fourth location in a seventh row of the split matrix $S_1$ is filled with a second non-negative element in the fourth row, and a remaining location of the split matrix $S_2$ is filled with an element −1, to obtain the split matrix $S_2$ shown in FIG. 3.

Likewise, based on the initial matrix shown in FIG. 4, when step 1 is performed, during a first transformation, a first location in a second row of a split matrix $S_1$ is filled with a first non-negative element in a first row of the initial matrix, a second location in a first row of the split matrix $S_1$ is filled with a second non-negative element in the first row, a second location in a fourth row of the split matrix $S_1$ is filled with a first non-negative element in a second row of the initial matrix, a third location in a third row of the split matrix $S_1$ is filled with a second non-negative element in the second row, a first location in a sixth row of the split matrix $S_1$ is filled with a first non-negative element in a third row of the initial matrix, a third location in a fifth row of the split matrix $S_1$ is filled with a second non-negative element in the third row, and a remaining location of the split matrix $S_1$ is filled with an element −1, to obtain the split matrix $S_1$ shown in FIG. 4. Likewise, a split matrix $S_2$ shown in FIG. 4 may be obtained through a second transformation.

Step 2: Generate a supplementary matrix $A_i$ according to $$A_{d,e} = \begin{cases} 0 & (d, e) \in \{(d, e), d = e*2 - 0 \vee d = e*2 - 1\} \\ -1 & \text{others} \end{cases}.$$

$A_{d,e}$ represents an element in a $d^{th}$ row and an $e^{th}$ column of the supplementary matrix $A_i$, d is an integer greater than 0 and less than $2^i m$, and e is an integer greater than 0 and less than $2^{i-1} m$. After the split matrix $S_i$ is constructed based on step 1, the supplementary matrix $A_i$ of the split matrix $S_i$ may be constructed according to the foregoing formula. A row quantity and a column quantity of the supplementary matrix $A_i$ are the same as a row quantity and a column quantity of the split matrix $S_i$. In addition, a row weight of the supplementary matrix $A_i$ is 1, and a column weight of the supplementary matrix $A_i$ is 2. Elements 0 are vertically distributed on a diagonal by using 2 as an offset factor.

For example, based on the initial matrix shown in FIG. 3, a supplementary matrix $A_1$ and a supplementary matrix $A^2$ shown in FIG. 3 may be obtained according to the foregoing formula.

For example, based on the initial matrix shown in FIG. 4, a supplementary matrix $A_1$, and a supplementary matrix $A_2$ shown in FIG. 4 may be obtained according to the foregoing formula.

Step 3: Concatenate the split matrix $S_i$ and the supplementary matrix $A_i$ to obtain an i-order transformation matrix $H_i=[S_i, A_i]$.

After the split matrix $S_i$ and the supplementary matrix $A_i$ are obtained, the split matrix $S_i$ and the supplementary matrix $A_i$ may be concatenated to obtain the i-order transformation matrix $H_i=[S_i, A_i]$.

For example, based on the initial matrix shown in FIG. 3, a 1-order transformation matrix $H_1$ and a 2-order transformation matrix $H_2$ shown in FIG. 3 may be obtained according to the foregoing formula.

For example, based on the initial matrix shown in FIG. 4, a 1-order transformation matrix $H_1$ and a 2-order transformation matrix $H_2$ shown in FIG. 4 may be obtained according to the foregoing formula.

If step 1 to step 3 are repeatedly performed k times, the k-order transformation matrix $H_k$ that meets the size of the check bit part may be obtained, that is, the check bit part of the base matrix may be obtained.

203. Determine an information bit part of the base matrix based on the check bit part.

For example, the information bit part of the base matrix may be determined based on the check bit part, a density evolution (DE) theory, and a progressive edge growth (PEG) algorithm. A specific generation process is stipulated in a communications standard, and details are not described herein in this embodiment of the present disclosure.

204. Obtain the base matrix based on the check bit part and the information bit part.

After the check bit part and the information bit part are obtained, the check bit part and the information bit part may be concatenated to obtain the base matrix. For example, the check bit part is P, and the information bit part is Q. In this case, the check bit part and the information bit part are concatenated to obtain the base matrix=[Q and P].

The base matrix obtained based on step 201 to step 204 has a fixed puncturing pattern, and the puncturing pattern of the base matrix is shown in Table 1.

TABLE 1

| Bit rate | Column number of a punctured column |
|---|---|
| $\frac{N-M}{N-1}$ | N |
| $\frac{N-M}{N-2}$ | N and N − 1 |
| $\frac{N-M}{N-3}$ | N, N − 1, and N − 2 |
| . . . | . . . |
| 1 | N, N − 1, . . . , and (N − M) + 1 |

In Table 1, M represents a row quantity of the base matrix, and N represents a column quantity of the base matrix. M is an integer greater than or equal to 1, and N is an integer greater than or equal to 1.

In addition, it should be noted that to obtain the base matrix generated in this embodiment of the present disclosure, the following manner may be used: An LDPC matrix having a diagonal structure is first constructed, and then a row and column transformation is performed on the LDPC matrix, so that a matrix obtained after the row and column transformation meets a structure of the base matrix in step 204.

In the method for generating a base matrix of an LDPC code provided in this embodiment of the present disclosure, first, the size of the check bit part of the base matrix is determined based on the required minimum bit rate, and the initial matrix is transformed k times based on the determined size of the check bit part, to obtain the check bit part of the base matrix; then the information bit part of the base matrix is determined based on the check bit part; and finally the base matrix is obtained based on the determined check bit part and information bit part. In this way, the generated base matrix has a fixed puncturing pattern, so as to ensure performance of a transformation matrix that is obtained by a receive end by transforming the base matrix based on the fixed puncturing pattern, thereby decreasing a probability of a decoding error.

Figure 5:
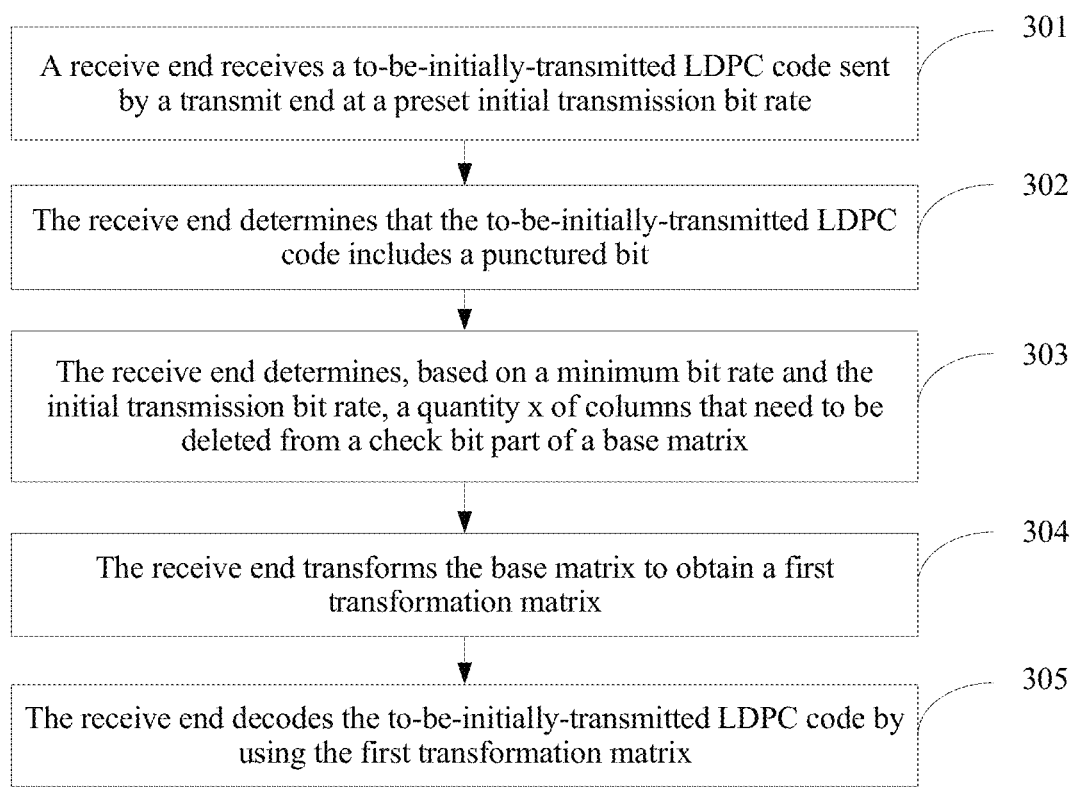
FIG. 5 is a flowchart of a decoding method according to an embodiment of the present disclosure.

FIG. 5 is a flowchart of a decoding method according to an embodiment of the present disclosure. The method is applied to a receive end, the base matrix in the embodiment shown in FIG. 1 is preconfigured for the receive end, and the base matrix corresponds to a preset minimum bit rate. As shown in FIG. 5, the method may include the following steps.

301. The receive end receives a to-be-initially-transmitted LDPC code sent by a transmit end at a preset initial transmission bit rate.

302. The receive end determines that the to-be-initially-transmitted LDPC code includes a punctured bit.

When the transmit end needs to send to-be-transmitted information to the receive end, to improve reliability and effectiveness of transmission of the to-be-transmitted information on a channel, the transmit end may encode the to-be-transmitted information based on the base matrix in the embodiment shown in FIG. 1. After the transmit end encodes the to-be-transmitted information based on the base matrix in the embodiment shown in FIG. 1, if a bit rate of an obtained LDPC code is equal to a minimum bit rate, before sending the LDPC code obtained through encoding, the transmit end determines, based on the initial transmission bit rate, whether there is a need to puncture the LDPC code obtained through encoding. If there is a need to puncture the LDPC code obtained through encoding, the transmit end punctures the LDPC code obtained through encoding, to obtain a to-be-initially-transmitted LDPC code, and then sends the to-be-initially-transmitted LDPC code to the receive end. Therefore, after receiving the to-be-initially-transmitted LDPC code, the receive end may first determine, based on whether the initial transmission bit rate is greater than the minimum bit rate, whether the to-be-initially-transmitted LDPC code includes a punctured bit. If the initial transmission bit rate is greater than the minimum bit rate, the receive end may determine that the to-be-initially-transmitted LDPC code includes a punctured bit, and then perform the following step 303. If the initial transmission bit rate is not greater than the minimum bit rate, the receive end may determine that the to-be-initially-transmitted LDPC code includes no punctured bit. In this case, the receive end may first combine soft values of repeated bits that may exist, and then decode the to-be-initially-transmitted LDPC code by directly using the base matrix without performing any transformation on the preconfigured base matrix.

303. The receive end determines, based on a minimum bit rate and the initial transmission bit rate, a quantity x of columns that need to be deleted from a check bit part of the base matrix.

When determining that the to-be-initially-transmitted LDPC code includes a punctured bit, the receive end needs to first transform the base matrix to obtain a transformation matrix, and then decode the to-be-initially-transmitted LDPC code based on the transformation matrix. In this case, the receive end may first determine a quantity of punctured bits based on the minimum bit rate and the initial transmission bit rate at which the transmit end sends the to-be-initially-transmitted LDPC code, that is, determine the quantity x of columns that need to be deleted from the check bit part of the base matrix, to transform the base matrix to obtain a transformation matrix whose bit rate is equal to the initial transmission bit rate.

304. The receive end transforms the base matrix to obtain a first transformation matrix.

A bit rate of the first transformation matrix is equal to the initial transmission bit rate. After determining the quantity x of columns that need to be deleted from the check bit part of the base matrix, the receive end may delete, based on determined x, the x columns starting from a last column in the check bit part of the base matrix, and combine rows corresponding to each column when the column is deleted, to obtain the first transformation matrix. Combining the rows corresponding to the column is performing, based on a corresponding location, modulo-2 addition on elements in the rows corresponding to the column.

305. The receive end decodes the to-be-initially-transmitted LDPC code by using the first transformation matrix.

After obtaining the first transformation matrix through a transformation, the receive end may decode the to-be-initially-transmitted LDPC code by using the first transformation matrix, to obtain the to-be-transmitted information that the transmit end needs to transmit to the receive end.

In the decoding method provided in this embodiment of the present disclosure, when determining that the to-be-initially-transmitted LDPC code sent by the transmit end includes a punctured bit, the receive end first determines, based on the minimum bit rate and the initial transmission bit rate, the quantity x of columns that need to be deleted from the check bit part of the base matrix; then deletes the x columns starting from the last column in the check bit part of the base matrix, and combines the rows corresponding to each row when the row is deleted, to obtain the first transformation matrix whose bit rate is equal to the initial transmission bit rate; and finally decodes the to-be-initially-transmitted LDPC code by using the obtained first transformation matrix. The receive end obtains a transformation matrix by transforming the base matrix based on a fixed puncturing pattern, that is, transforming the base matrix in a manner in which the receive end deletes, starting from the last column in the check bit part of the base matrix, a corresponding quantity of columns from the check bit part of the base matrix based on x, and combines rows corresponding to each column when the column is deleted, so that performance of the transformation matrix is ensured, thereby decreasing a probability of a decoding error.

Figure 6:
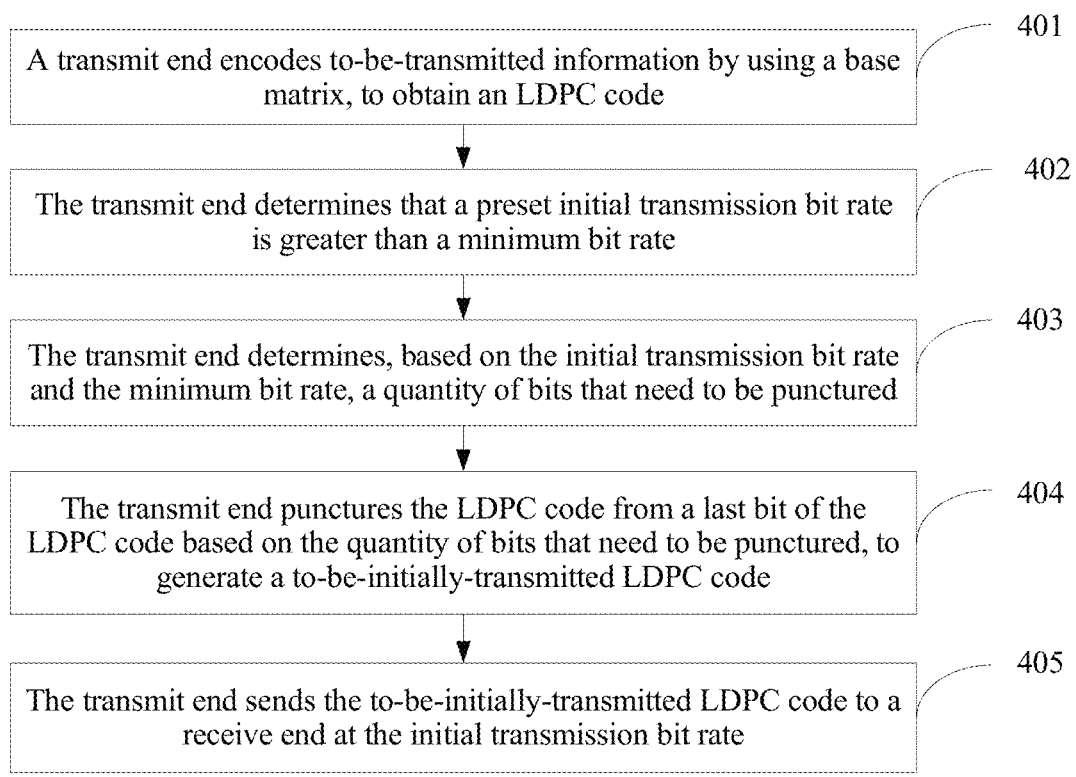
FIG. 6 is a flowchart of an encoding method according to an embodiment of the present disclosure.

FIG. 6 is a flowchart of an encoding method according to an embodiment of the present disclosure. The method is applied to a transmit end, the base matrix in the embodiment shown in FIG. 1 is preconfigured for the transmit end, and the base matrix corresponds to a preset minimum bit rate. As shown in FIG. 6, the method may include the following steps.

401. The receive end encodes to-be-transmitted information by using the base matrix, to obtain an LDPC code.

When the transmit end needs to send the to-be-transmitted information to a receive end, to improve reliability and effectiveness of transmission of the to-be-transmitted information on a channel, the transmit end may encode the to-be-transmitted information based on the base matrix in the embodiment shown in FIG. 1, to obtain an LDPC code suitable for channel transmission. A bit rate of the LDPC code is equal to a minimum bit rate.

In addition, in this embodiment of the present disclosure, the transmit end may first transform a check bit part of the base matrix into an equivalent bidiagonal matrix through a row and column transformation, and then quickly encode the to-be-transmitted information by using a simplified bidiagonal encoding algorithm. Correspondingly, if the transmit end uses the method to encode the to-be-transmitted information, the receive end may record, in advance, a sequence of performing the row and column transformation by the transmit end. Then, after receiving the LDPC code, the receive end first adjusts a sequence of the LDPC code based on the sequence of performing the row and column transformation by the transmit end, to obtain a sequence before the transformation, and then decodes the LDPC code.

402. The transmit end determines that a preset initial transmission bit rate is greater than a minimum bit rate.

After encoding the to-be-transmitted information to obtain the LDPC code, the transmit end may determine whether the preset initial transmission bit rate is greater than the minimum bit rate, and performs the following step 403 if the initial transmission bit rate is greater than the minimum bit rate.

Alternatively, if the initial transmission bit rate is equal to the minimum bit rate, the transmit end may directly use the LDPC code as a to-be-initially-transmitted LDPC code, and sends the to-be-initially-transmitted LDPC code to the receive end. Alternatively, if the initial transmission bit rate is less than the minimum bit rate, the transmit end determines, based on the initial transmission bit rate and the minimum bit rate, a quantity of bits that need to be repeated; and then repeats, from a first bit one by one, bits of the LDPC code obtained through encoding, and adds repeated bits to the LDPC code, to generate a to-be-initially-transmitted LDPC code; and sends the to-be-initially-transmitted LDPC code to the receive end.

403. The transmit end determines, based on the initial transmission bit rate and the minimum bit rate, a quantity of bits that need to be punctured.

If the transmit end determines that the initial transmission bit rate is greater than the minimum bit rate, it indicates that the LDPC code needs to be punctured. In this case, the transmit end may determine, based on the initial transmission bit rate and the minimum bit rate, the quantity of bits that need to be punctured.

404. The transmit end punctures the LDPC code from a last bit of the LDPC code based on the quantity of bits that need to be punctured, to generate a to-be-initially-transmitted LDPC code.

After determining the quantity of bits that need to be punctured, the transmit end may puncture the LDPC code from the last bit of the LDPC code based on the quantity of bits that need to be punctured, to generate the to-be-initially-transmitted LDPC code.

405. The transmit end sends the to-be-initially-transmitted LDPC code to a receive end at the initial transmission bit rate.

In the encoding method provided in this embodiment of the present disclosure, the transmit end encodes the to-be-transmitted information by using the base matrix, to obtain the LDPC code. If the transmit end determines that the initial transmission bit rate is greater than the minimum bit rate, the transmit end determines, based on the initial transmission bit rate and the minimum bit rate, the quantity of bits that need to be punctured; then punctures the LDPC code from the last bit of the LDPC code based on the quantity of bits that need to be punctured, to generate the to-be-initially-transmitted LDPC code; and finally sends the to-be-initially-transmitted LDPC code to the receive end at the initial transmission bit rate. The LDPC code is punctured from the last bit of the LDPC code to generate the to-be-initially-transmitted LDPC code. Therefore, the receive end may obtain a transformation matrix by transforming the base matrix based on a fixed puncturing pattern, that is, transforming the base matrix in a manner in which the receive end deletes, starting from the last column in the check bit part of the base matrix, a corresponding quantity of columns from the check bit part of the base matrix based on x, and combines rows corresponding to each column when the column is deleted, so that performance of the transformation matrix is ensured, thereby decreasing a probability of a decoding error.

Figure 8:
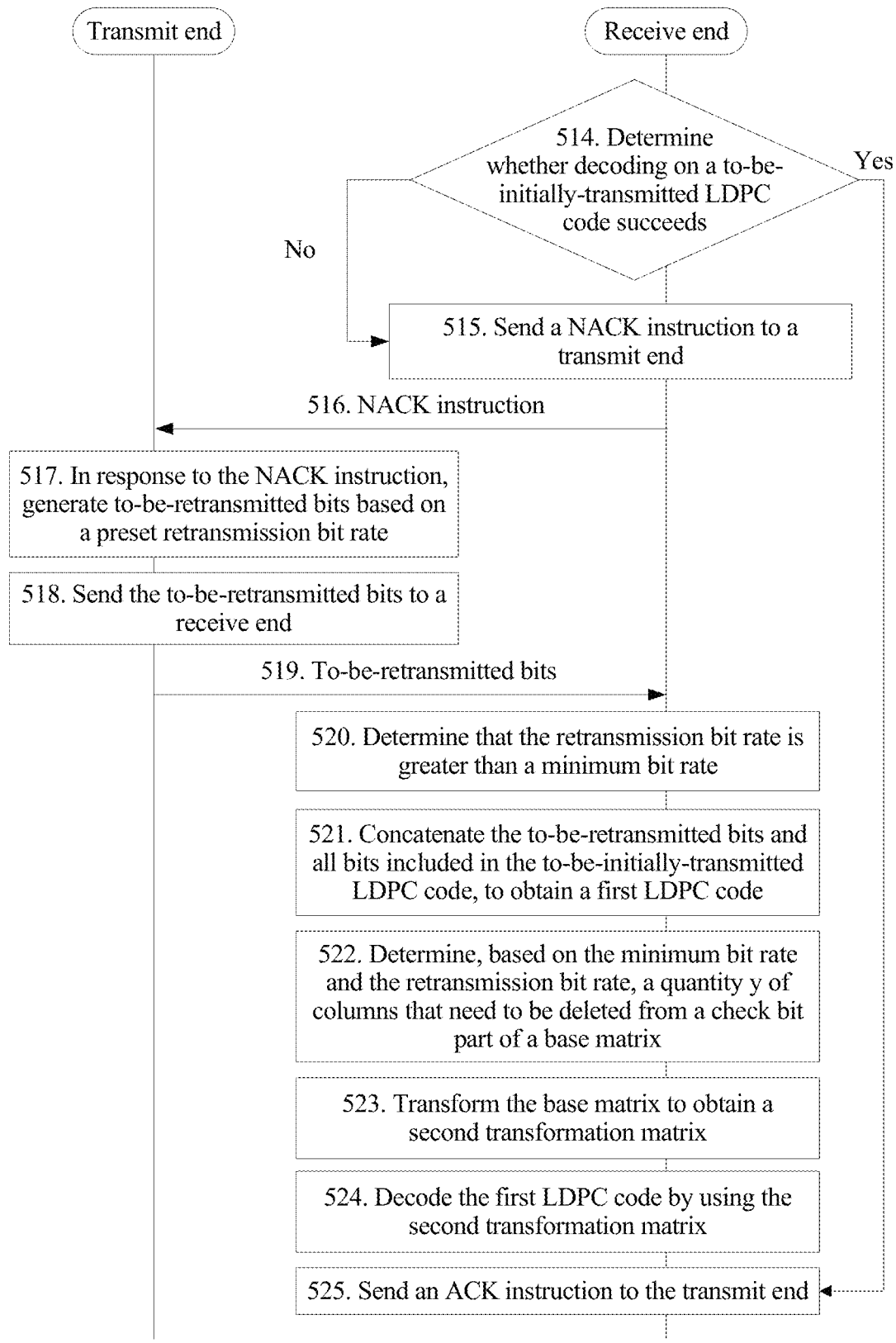
FIG. 8 is a flowchart of another encoding/decoding method according to an embodiment of the present disclosure.
Figure 9:
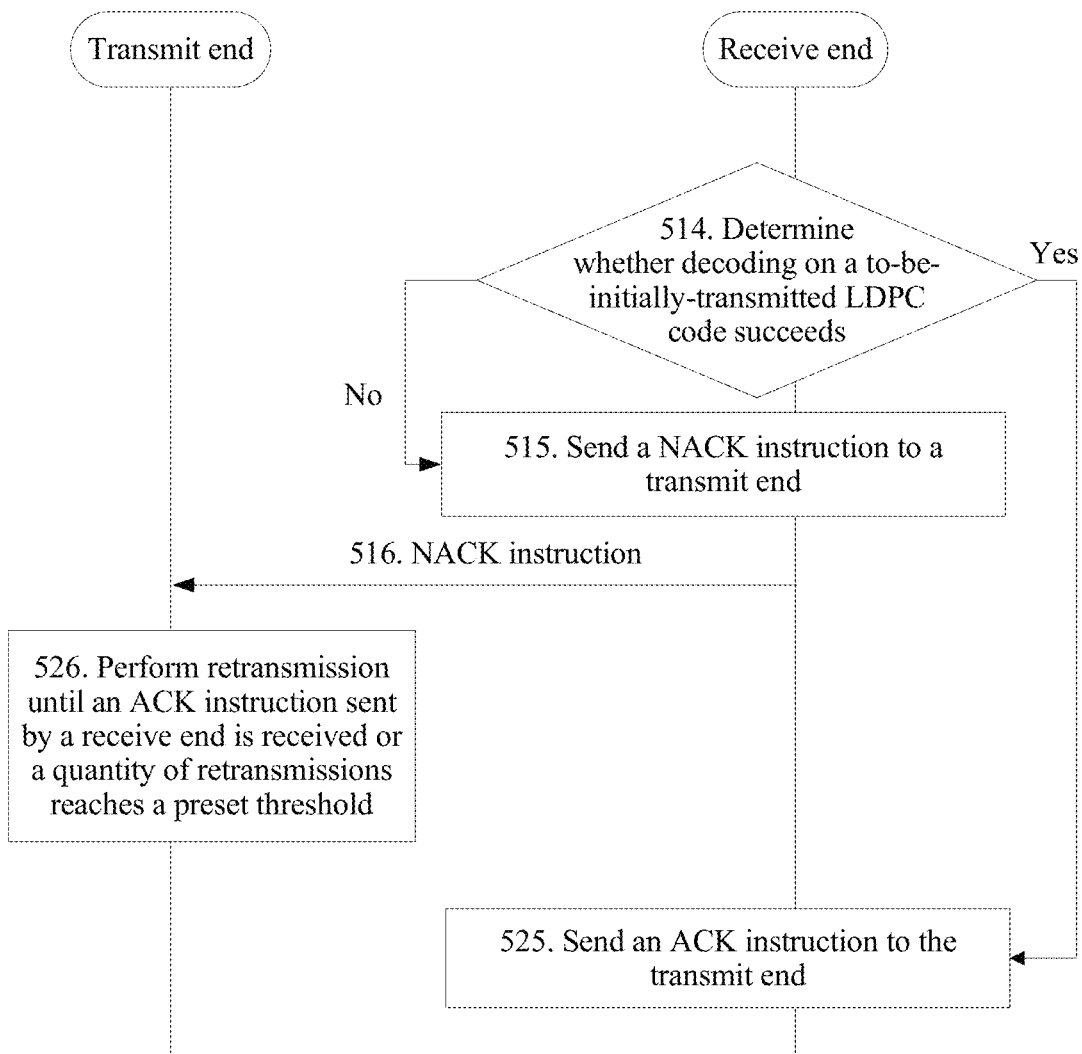
FIG. 9 is a flowchart of still another encoding/decoding method according to an embodiment of the present disclosure.
Figure 10:
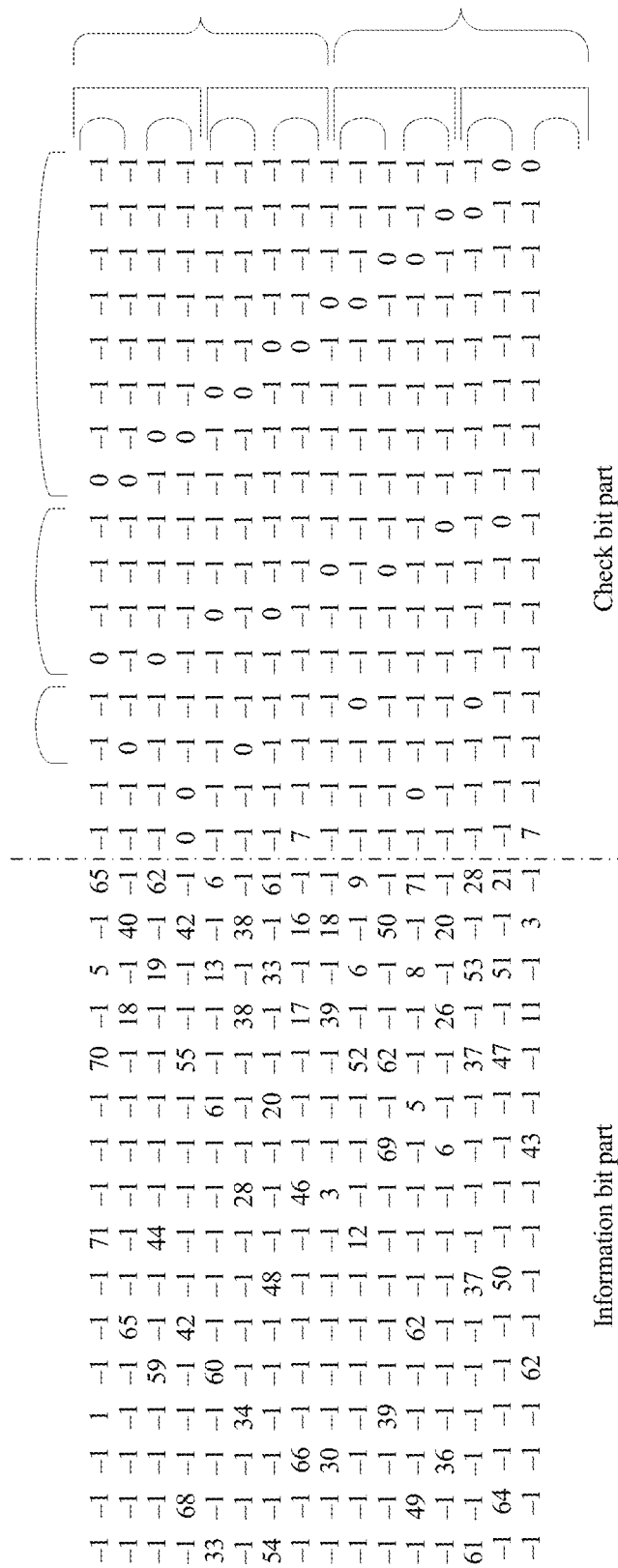
FIG. 10 is a schematic diagram of a base matrix according to an embodiment of the present disclosure.

FIG. 7A to FIG. 9 are flowcharts of an encoding/decoding method according to an embodiment of the present disclosure. The method is applied to a wireless communications system, and the wireless communications system includes at least a transmit end and a receive end. The base matrix in the embodiment shown in FIG. 1 is preconfigured for each of the transmit end and the receive end, and the base matrix corresponds to a preset minimum bit rate. In addition, assuming that the base matrix preconfigured for each of the transmit end and the receive end is shown in FIG. 10, the minimum bit rate is equal to 0.5 in this case. It is assumed that an initial transmission bit rate is 0.7. As shown in FIG. 7A to FIG. 9, the method may include the following steps.

Figure 7A:
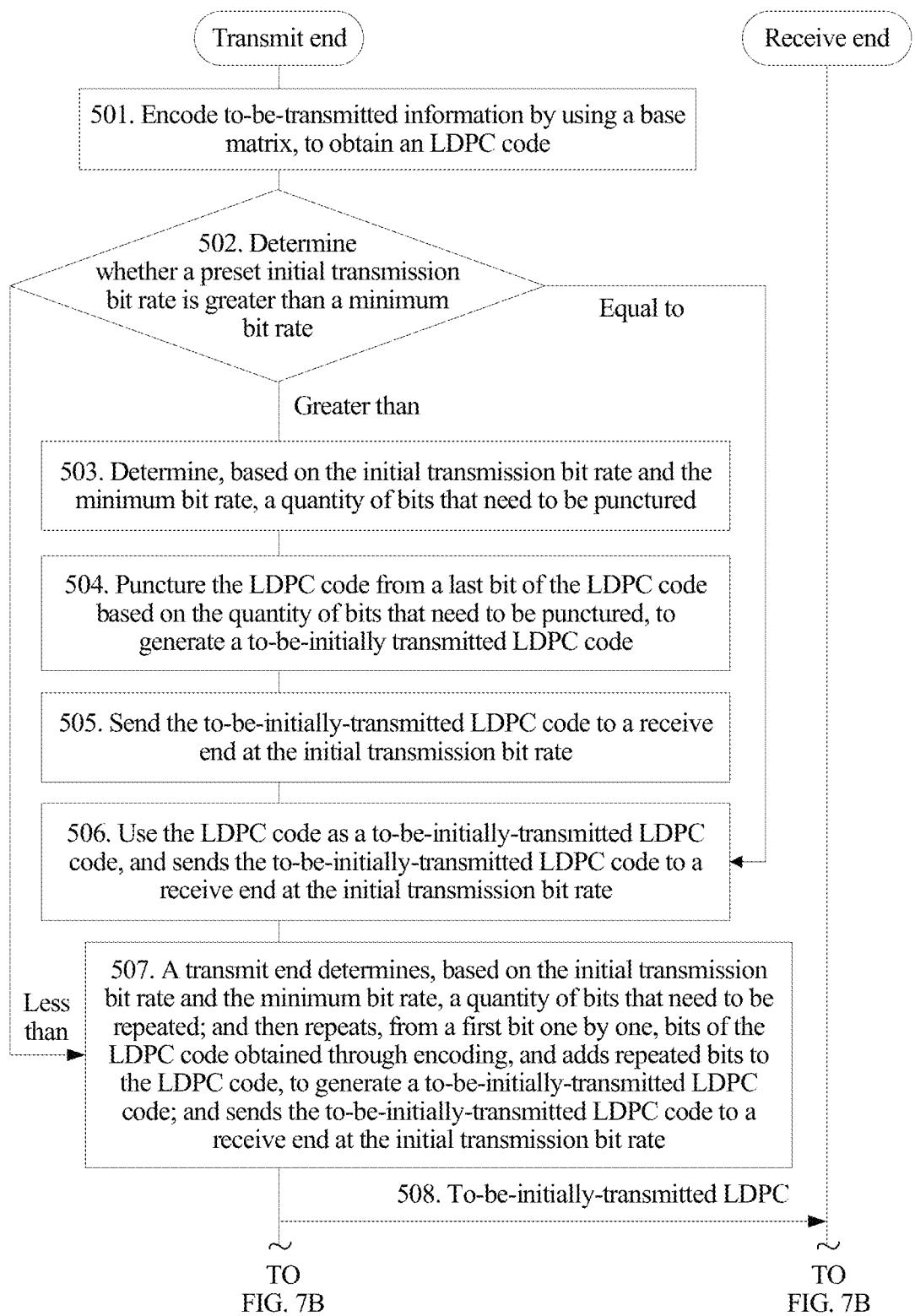
FIG. 7A and FIG. 7B are a flowchart of an encoding/decoding method according to an embodiment of the present disclosure.
Figure 7B:
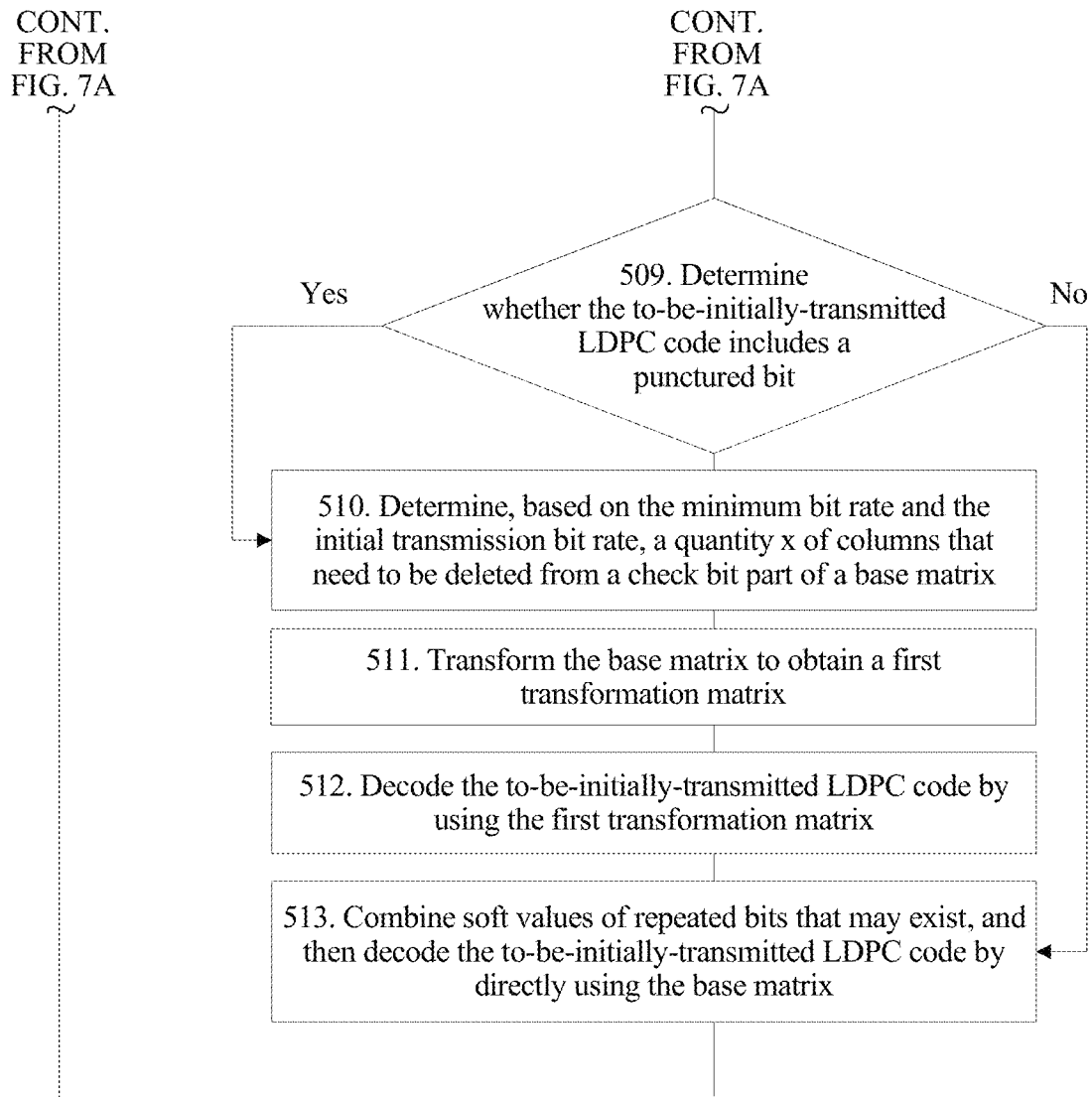

When the transmit end needs to send to-be-transmitted information to the receive end, the transmit end may complete an initial transmission process by using step 501 to step 513 shown in FIG. 7A and FIG. 7B. Details are as follows.

501. The transmit end encodes the to-be-transmitted information by using the base matrix, to obtain an LDPC code.

To improve reliability and effectiveness of transmission of the to-be-transmitted information on a channel, the transmit end may encode the to-be-transmitted information based on the base matrix shown in FIG. 10, to obtain the LDPC code. A bit rate of the LDPC code is equal to the minimum bit rate. A specific encoding process is stipulated in a communications standard, and details are not described herein in this embodiment of the present disclosure.

Specifically, the transmit end may first extend the base matrix shown in FIG. 10 to obtain a corresponding check matrix, and then encode the to-be-transmitted information by using the obtained check matrix, to obtain the LDPC code. After all elements with a value of −1 in the base matrix are extended, an all-zero matrix with a size of z×z is obtained. After the other elements are extended, a permutation matrix with a size of z×z is obtained, and z is an actual extension factor. The permutation matrix may be obtained by performing a cyclic shift on an identity matrix based on a corresponding quantity of shifts, and the quantity of shifts corresponds to a value of the element. Specifically, the value of the element may be transformed according to the following formula (1), to obtain the quantity of shifts.

$$p(f, i, j) = \begin{cases} p(i, j), & p(i, j) \leq 0 \\ \left\lfloor \dfrac{p(i, j) z_f}{z_0} \right\rfloor, & p(i, j) > 0 \end{cases} \quad (1)$$

In the formula (1), $z_0 = 96$ is a maximum value of an extension factor, $z_f$ is an actual extension factor, $p(i,j)$ is a value of an element in an $i^{th}$ row and a $j^{th}$ column of the base matrix, $\lfloor \ \rfloor$ represents rounding down, and $p(f,i,j)$ represents the quantity of shifts.

For example, a seventeenth element in an eighth row of the base matrix shown in FIG. 10 is 7. Assuming that the actual extension factor z=12, a corresponding permutation matrix may be obtained by cyclically shifting an identity matrix seven times to the right. The identity matrix and the obtained permutation matrix are shown in FIG. 11.

For example, it is assumed that the extension factor is 4, the to-be-transmitted information is 0000 1100 1111 0001 0101 0101 0100 0111 1011 0111 1000 0001 1100 0001 1001 0011, the LDPC code obtained through encoding that is performed by using the check matrix obtained by extending the base matrix shown in FIG. 10 is 0000 1100 1111 0001 0101 0101 0100 0111 1011 0111 1000 0001 1100 0001 1001 0011 0101 1110 0101 1101 0110 0010 0000 0100 0001 0011 1010 0011 0011 1001 0011 1011, and the bit rate of the LDPC code is 0.5.

502. The transmit end determines whether the preset initial transmission bit rate is greater than the minimum bit rate.

After encoding the to-be-transmitted information to obtain the LDPC code, the transmit end may determine whether the preset initial transmission bit rate is greater than the minimum bit rate; and performs the following step 503 to step 505 if the initial transmission bit rate is greater than the minimum bit rate; or performs step 506 if the initial transmission bit rate is equal to the minimum bit rate; or performs step 507 if the initial transmission bit rate is less than the minimum bit rate.

503. The transmit end determines, based on the initial transmission bit rate and the minimum bit rate, a quantity of bits that need to be punctured.

If the transmit end determines that the initial transmission bit rate is greater than the minimum bit rate, it indicates that the LDPC code needs to be punctured. In this case, the transmit end may determine, based on the initial transmission bit rate and the minimum bit rate, the quantity of bits that need to be punctured.

For example, based on the initial transmission bit rate of 0.7 and the minimum bit rate of 0.5, the determined quantity of bits that need to be punctured is 4. It should be noted that when the quantity that is of bits that need to be punctured and that is calculated based on the initial transmission bit rate and the minimum bit rate is a decimal, a quantity of bits that actually need to be punctured may be determined according to a rule of rounding up or rounding down. In this embodiment of the present disclosure, rounding up is used as an example.

504. The transmit end punctures the LDPC code from a last bit of the LDPC code based on the quantity of bits that need to be punctured, to generate a to-be-initially-transmitted LDPC code.

For example, the LDPC code is punctured from the last bit of the LDPC code based on the determined quantity, namely, 4, of bits that need to be punctured, to generate the to-be-initially-transmitted LDPC code: 0000 1100 1111 0001 0101 0101 0100 0111 1011 0111 1000 0001 1100 0001 1001 0011 0101 1110 0101 1101 0110 0010 0000 0100 0001 0011 1010 0011 0011 1001 0011.

505. The transmit end sends the to-be-initially-transmitted LDPC code to a receive end at the initial transmission bit rate.

506. The transmit end uses the LDPC code as a to-be-initially-transmitted LDPC code, and sends the to-be-initially-transmitted LDPC code to a receive end at the initial transmission bit rate.

507. The transmit end determines, based on the initial transmission bit rate and the minimum bit rate, a quantity of bits that need to be repeated; and then repeats, from a first bit one by one, bits of the LDPC code obtained through encoding, and adds repeated bits to the LDPC code, to generate a to-be-initially-transmitted LDPC code; and sends the to-be-initially-transmitted LDPC code to a receive end at the initial transmission bit rate.

508. The receive end receives the to-be-initially-transmitted LDPC code sent by the transmit end at the preset initial transmission bit rate.

509. The receive end determines whether the to-be-initially-transmitted LDPC code includes a punctured bit.

After receiving the to-be-initially-transmitted LDPC code, the receive end may first determine whether the to-be-initially-transmitted LDPC code includes a punctured bit; and perform the following step 510 to step 512 if the to-be-initially-transmitted LDPC code includes a punctured bit; or perform the following step 513 if the to-be-initially-transmitted LDPC code includes no punctured bit.

510. The receive end determines, based on the minimum bit rate and the initial transmission bit rate, a quantity x of columns that need to be deleted from a check bit part of the base matrix.

When determining that the to-be-initially-transmitted LDPC code includes a punctured bit, the receive end needs to first transform the base matrix to obtain a transformation matrix, and then decode the to-be-initially-transmitted LDPC code based on the transformation matrix. In this case, the receive end may first determine, based on the minimum bit rate and the initial transmission bit rate at which the transmit end sends the to-be-initially-transmitted LDPC code, the quantity x of columns that need to be deleted from the check bit part of the base matrix, to transform the base matrix to obtain a transformation matrix whose bit rate is equal to the initial transmission bit rate.

For example, based on the initial transmission bit rate of 0.7 and the minimum bit rate of 0.5, it may be obtained that the quantity x of columns that need to be deleted from the check bit part of the base matrix is equal to 4. It should be noted that when the quantity that is of columns that need to be deleted from the check bit part of the base matrix and that is calculated based on the initial transmission bit rate and the minimum bit rate is a decimal, a quantity of columns that actually need to be deleted from the check bit part of the base matrix may be determined according to a rule of rounding up or rounding down. In this embodiment of the present disclosure, rounding up is used as an example.

511. The receive end transforms the base matrix to obtain a first transformation matrix.

After determining the quantity x of columns that need to be deleted from the check bit part of the base matrix, the receive end may delete, based on determined x, the x columns starting from a last column in the check bit part of the base matrix, and combine rows corresponding to each column when the column is deleted, to obtain the first transformation matrix. For each column in the check bit part of the base matrix, the receive end pre-stores a correspondence between the column and a row corresponding to the column.

A $(2^k m)^{th}$ column in the check bit part corresponds to each of a $(2^k m)^{th}$ row and a $(2^k m-1)^{th}$ row of the base matrix; and a $(2^k m-1)^{th}$ column in the check bit part corresponds to each of a $(2m-2)^{th}$ row and a $(2^k m-3)^{th}$ row of the base matrix. By analogy, a $(2^{k-1} m+1)^{th}$ column in the check bit part corresponds to each of a second row and a first row of the base matrix.

A $(2^{k-1} m)^{th}$ column in the check bit part corresponds to each of the $(2^k m)^{th}$ row, the $(2^k m-1)^{th}$ row, the $(2^k m-2)^{th}$ row, and the $(2^k m-3)^{th}$ row of the base matrix; and a $(2^{k-1} m-1)^{th}$ column in the check bit part corresponds to each of a $(2^k m-4)^{th}$ row, a $(2^k m-5)^{th}$ row, a $(2^k m-6)^{th}$ row, and a $(2^k m-7)^{th}$ row of the base matrix. By analogy, a $(2^{k-2} m+1)^{th}$ column in the check bit part corresponds to each of a fourth row, a third row, the second row, and the first row of the base matrix.

A $(2^j m)^{th}$ column in the check bit part corresponds to each of the $(2^k m)^{th}$ row, the $(2^k m-1)^{th}$ row, the $(2^k m-2)^{th}$ row, ..., and a $(2^k m-2^{k-j+1}+1)^{th}$ row of the base matrix; and a $(2^j m-1)^{th}$ column in the check bit part corresponds to each of a $(2^k m-2^{k-j+1})^{th}$ row, a $(2^k m-2^{k-j+1}-1)^{th}$, a $(2^k m-2^{k-j+1}-2)^{th}$ row, ..., and a $(2^k m-2^{k-j-1}-2)^{th}$ row of the base matrix. By analogy, a $(2^{j-1} m+1)^{th}$ column in the check bit part corresponds to each of a $(2^{k-j+1})^{th}$ row, ..., the second row, and the first row of the base matrix, where j is an integer greater than 0 and less than k.

A $(2^2m)^{th}$ column in the check bit part corresponds to each of the $(2^km)^{th}$ row, the $(2^km-1)^{th}$ row, the $(2^km-2)^{th}$ row, ..., and a $(2^km-2^{k-1}+1)^{th}$ row of the base matrix; and a $(2^2m-1)^{th}$ column in the check bit part corresponds to each of a $(2^km-2^{k-1})^{th}$ row, a $(2^km-2^{k-1}-1)^{th}$ row, a $(2^km-2^{k-2}-2)^{th}$ row, ..., and a $(2^km-2^k)^{th}$ row of the base matrix. By analogy, a $(2^1m+1)^{th}$ column in the check bit part corresponds to each of a $(2^{k-1})^{th}$ row, ..., the second row, and the first row of the base matrix.

A $(2^1m)^{th}$ column in the check bit part corresponds to each of the $(2^km)^{th}$ row, the $(2^km-1)^{th}$ row, the $(2^km-2)^{th}$ row, ..., and a $(2^km-2^k+1)^{th}$ row of the base matrix; and a $(2^1m-1)^{th}$ column in the check bit part corresponds to each of a $(2^km-2^k)^{th}$ row, a $(2^km-2^k-1)^{th}$ row, a $(2^km-2^k-2)^{th}$ row, ..., and a $(2^km-2^{k+1})^{th}$ row of the base matrix. By analogy, a $(2^0m+1)^{th}$ column in the check bit part corresponds to each of a $(2^k)^{th}$ row, ..., the second row, and the first row of the base matrix.

For example, based on the base matrix (the check bit part of the base matrix is obtained by performing three transformations based on an initial matrix, and the initial matrix is a square matrix with a size of 2×2) shown in FIG. 10, the last column in the check bit part corresponds to each of a fifteenth row and a sixteenth row of the base matrix, a second-from-last column in the check bit part corresponds to each of a thirteenth row and a fourteenth row of the base matrix, a third-from-last column in the check bit part corresponds to each of an eleventh row and a twelfth row of the base matrix, and a fourth-from-last column in the check bit part corresponds to each of a ninth row and a tenth row of the base matrix. By analogy, an eighth-from-last column in the check bit part corresponds to each of the first row and the second row of the base matrix, a ninth-from-last column in the check bit part corresponds to each of the thirteenth row to the sixteenth row of the base matrix, and a tenth-from-last column in the check bit part corresponds to each of the ninth row to the twelfth row of the base matrix. By analogy, a twelfth-from-last column in the check bit part corresponds to each of the first row to the fourth row of the base matrix, a thirteenth-from-last column in the check bit part corresponds to each of the ninth row to the sixteenth row of the base matrix, and a fourteenth-from-last column in the check bit part corresponds to each of the first row to the eighth row of the base matrix. Based on such a correspondence, the receive end may delete, starting from the last column in the check bit part of the base matrix, a corresponding quantity of columns from the check bit part of the base matrix based on x, and combine rows corresponding to each column when the column is deleted, to obtain the first transformation matrix.

For example, based on the example in step 510, the quantity of columns that need to be deleted is 4. In this case, referring to FIG. 10, the last four columns in the check bit part may be deleted, and rows corresponding to the four columns are combined. To be specific, the last column is deleted, and modulo-2 addition is performed, based on a corresponding location, on elements in the fifteenth row and the sixteenth row of the base matrix that correspond to the last column; the second-from-last column is deleted, and modulo-2 addition is performed, based on a corresponding location, on elements in the thirteenth row and the fourteenth row of the base matrix that correspond to the second-from-last column; the third-from-last column is deleted, and modulo-2 addition is performed, based on a corresponding location, on elements in the eleventh row and the twelfth row of the base matrix that correspond to the third-from-last column; and the fourth-from-last column is deleted, and modulo-2 addition is performed, based on a corresponding location, on elements in the ninth row and the tenth row of the base matrix that correspond to the fourth-from-last column, to obtain the first transformation matrix.

It should be noted that in a process in which a column is deleted and rows corresponding to the column are combined, a $(2^km)^{th}$ column to a $(2^{k-1}+1)^{th}$ column may be first deleted, and rows corresponding to the columns are combined, to obtain a transformation matrix less than the base matrix. Then, based on the transformation matrix less than the base matrix, a $(2^{k-1}m)^{th}$ column to a $(2^{k-2}m+1)^{th}$ column are further deleted, and rows corresponding to the columns are combined, and so on.

Figure 12:
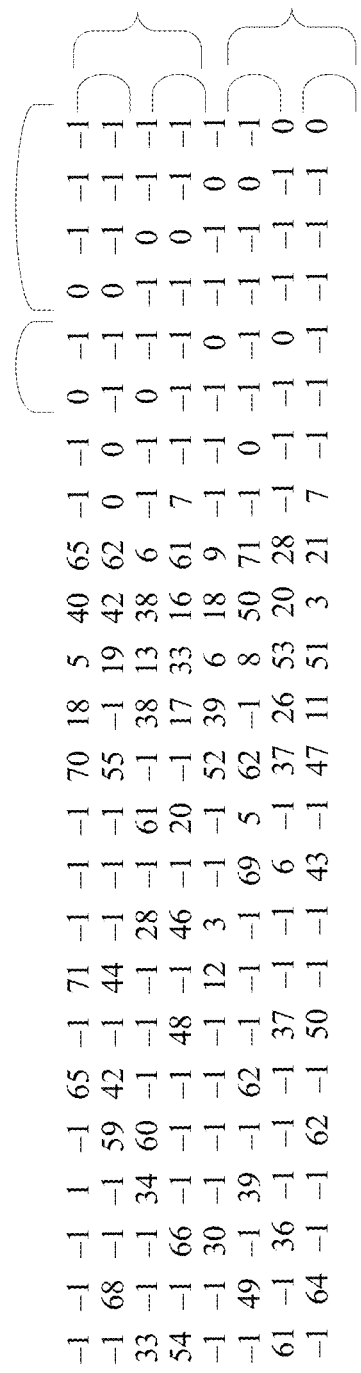
FIG. 12 is a schematic diagram of a transformation matrix according to an embodiment of the present disclosure.

For example, assuming that the quantity of columns that need to be deleted is 10, the ninth column to the sixteenth column in the check bit part may be first deleted and rows corresponding to each column are combined, to obtain a transformation matrix shown in FIG. 12. Then based on the transformation matrix shown in FIG. 12, a last column (the last column corresponds to an eighth column of the base matrix) and a second-from-last column (the second-from-last corresponds to a seventh column of the base matrix) are deleted and rows corresponding to each column are combined.

512. The receive end decodes the to-be-initially-transmitted LDPC code by using the first transformation matrix.

513. The receive end combines soft values of repeated bits that may exist, and then decodes the to-be-initially-transmitted LDPC code by directly using the base matrix.

It should be noted that a specific decoding process is stipulated in a communications standard, and details are not described herein in this embodiment of the present disclosure.

After step 501 to step 513 shown in FIG. 7A and FIG. 7B are performed, a process of initial transmission from the transmit end to the receive end is completed. Further, if the receive end determines that initial transmission fails, retransmission may be performed by performing the following step 514 to step 526. Specifically, as shown in FIG. 8, when the to-be-initially-transmitted LDPC code includes a punctured bit, a retransmission process includes the following step 514 to step 525. As shown in FIG. 9, when the to-be-initially-transmitted LDPC code includes no punctured bit, a retransmission process includes the following step 514 to step 516 and step 525 to step 526.

514. The receive end determines whether decoding on the to-be-initially-transmitted LDPC code succeeds.

After decoding the to-be-initially-transmitted LDPC code, the receive end may determine whether decoding on the to-be-initially-transmitted LDPC code succeeds; and may perform the following step 515 to step 524 if decoding on the to-be-initially-transmitted LDPC code fails; or may perform the following step 525 if decoding on the to-be-initially-transmitted LDPC code succeeds.

515. The receive end sends a NACK instruction to the transmit end.

516. The transmit end receives the NACK instruction sent by the receive end.

517. In response to the NACK instruction, the transmit end generates to-be-retransmitted bits based on a preset retransmission bit rate.

The to-be-retransmitted bits include some or all punctured bits, or the to-be-retransmitted bits include all punctured bits and bits obtained by repeating bits of the LDPC code one by one from the first bit. When a quantity of punctured bits meets a requirement of the retransmission bit rate, the transmit end may form the to-be-retransmitted bits by using some or all of the punctured bits; or when a quantity of punctured bits does not meet a requirement of the retransmission bit rate, the transmit end may form the to-be-retransmitted bits by using all the punctured bits and the bits obtained by repeating bits of the LDPC code one by one from the first bit.

518. The transmit end sends the to-be-retransmitted bits to the receive end.

519. The receive end receives the to-be-retransmitted bits sent by the transmit end.

520. The transmit end determines that the retransmission bit rate is greater than the minimum bit rate.

After receiving the to-be-retransmitted bits sent by the transmit end, the receive end needs to first determine whether the retransmission bit rate is greater than the minimum bit rate. If the retransmission bit rate is greater than the minimum bit rate, it indicates that a first LDPC code obtained after the received to-be-retransmitted bits and all bits included in the to-be-initially-transmitted LDPC code are concatenated (concatenating the to-be-retransmitted bits and all the bits included in the to-be-initially-transmitted LDPC code is adding the to-be-retransmitted bits to all the bits included in the to-be-initially-transmitted LDPC code) still includes a punctured bit. In this case, the receive end may perform the following step 521 to step 524. Alternatively, if the retransmission bit rate is less than the minimum bit rate, it indicates that the to-be-retransmitted bits include a bit repeated with a bit included in the to-be-initially-transmitted LDPC code. In this case, the receive end may first combine the to-be-retransmitted bits and a soft value that is in the bit included in the to-be-initially-transmitted LDPC code and that represents a same bit; and then concatenate bits obtained after the combination and a remaining bit, to obtain a first LDPC code, and decode the first LDPC code by directly using the base matrix. Alternatively, if the retransmission bit rate is equal to the minimum bit rate, the receive end may directly concatenate the to-be-retransmitted bits and all bits included in the to-be-initially-transmitted LDPC code, to obtain a first LDPC code, and then decode the first LDPC code by directly using the base matrix.

521. The receive end concatenates the to-be-retransmitted bits and all bits included in the to-be-initially-transmitted LDPC code, to obtain a first LDPC code.

After receiving the to-be-retransmitted bits retransmitted by the transmit end and determining that the retransmission bit rate is greater than the minimum bit rate, the receive end may concatenate the retransmitted to-be-retransmitted bits and the to-be-initially-transmitted LDPC code, to obtain the first LDPC code. A bit rate of the first LDPC code is equal to the retransmission bit rate.

522. The receive end determines, based on the minimum bit rate and the retransmission bit rate, a quantity y of columns that need to be deleted from the check bit part of the base matrix.

Because the retransmission bit rate is greater than the minimum bit rate, it indicates that the first LDPC code includes a punctured bit. In this case, the base matrix needs to be transformed again to obtain a transformation matrix. Therefore, the receive end needs to determine, based on the minimum bit rate and the retransmission bit rate, the quantity y of columns that need to be deleted from the check bit part of the base matrix.

523. The receive end transforms the base matrix to obtain a second transformation matrix.

The receive end may delete the y columns starting from the last column in the check bit part of the base matrix, and combine rows corresponding to each column when the column is deleted, to obtain the second transformation matrix. A bit rate of the second transformation matrix is equal to the retransmission bit rate.

It should be noted that in this embodiment of the present disclosure, a specific transformation process in step 523 is similar to a specific transformation process in step 511. For specific description, refer to the description in step 511. Details are not described herein again in this embodiment of the present disclosure.

524. The receive end decodes the first LDPC code by using the second transformation matrix.

Specifically, the receive end may first extend the second transformation matrix to obtain a check matrix corresponding to the second transformation matrix, and then decode the first LDPC code by using the obtained check matrix. For an extension process, refer to the corresponding description in step 501 in this embodiment of the present disclosure. Details are not described herein again in this embodiment of the present disclosure.

After decoding the first LDPC code by using the second transformation matrix, the receive end may continue to determine whether decoding on the first LDPC code succeeds. If the receive end determines that decoding on the first LDPC code fails, the receive end needs to send the NACK instruction again to the transmit end. If the transmit end receives again the NACK instruction sent by the receive end, the transmit end needs to re-generate second to-be-retransmitted bits, and send the second to-be-retransmitted bits to the receive end until receiving an acknowledgement ACK instruction sent by the receive end or a quantity of retransmissions reaches a preset threshold.

525. The receive end sends an ACK instruction to the transmit end.

526. The transmit end performs retransmission until receiving an ACK instruction sent by the receive end or a quantity of retransmissions reaches a preset threshold.

If the transmit end receives the NACK instruction sent by the receive end, it indicates that decoding on the to-be-initially-transmitted LDPC code fails. In this case, the transmit end performs retransmission until receiving the ACK instruction sent by the receive end or the quantity of retransmissions reaches the preset threshold.

In the encoding/decoding method provided in this embodiment of the present disclosure, the transmit end encodes the to-be-transmitted information by using the base matrix, to obtain the LDPC code. If the transmit end determines that the initial transmission bit rate is greater than the minimum bit rate, the transmit end determines, based on the initial transmission bit rate and the minimum bit rate, the quantity of bits that need to be punctured; then punctures the LDPC code from the last bit of the LDPC code based on the quantity of bits that need to be punctured, to generate the to-be-initially-transmitted LDPC code; and finally sends the to-be-initially-transmitted LDPC code to the receive end at the initial transmission bit rate. The LDPC code is punctured from the last bit of the LDPC code to generate the to-be-initially-transmitted LDPC code. Therefore, the receive end may obtain a transformation matrix by transforming the base matrix based on a fixed puncturing pattern, that is, transforming the base matrix in a manner in which the receive end deletes, starting from the last column in the check bit part of the base matrix, a corresponding quantity of columns from the check bit part of the base matrix based on x, and combines rows corresponding to each column when the column is deleted, so that performance of the transformation matrix is ensured, thereby decreasing a probability of a decoding error.

The foregoing describes the solutions provided in the embodiments of the present disclosure mainly from the perspective of interaction between network elements. It may be understood that, to implement the foregoing functions, each network element such as the device for generating an LDPC code of a base matrix, the receive end, or the transmit end includes corresponding hardware structures and/or software modules for performing the functions. A person of ordinary skill in the art should be easily aware that, the algorithm steps in the examples described with reference to the embodiments disclosed in this specification may be implemented by hardware or a combination of hardware and computer software in the present disclosure. Whether a function is performed by hardware or computer software driving hardware depends on particular applications and design constraint conditions of the technical solutions. A person skilled in the art may use different methods to implement the described functions for each particular application, but it should not be considered that the implementation goes beyond the scope of the present disclosure.

The device for generating an LDPC code of a base matrix, the receive end, and transmit end may be divided into function modules according to the method examples in the embodiments of the present disclosure. For example, each function module may be obtained through division for each function, or two or more functions may be integrated into one processing module. The integrated module may be implemented in a form of hardware, or may be implemented in a form of a software function module. It should be noted that the module division in the embodiments of the present disclosure is an example, and is merely logical function division. There may be another division manner in an actual implementation.

Figure 13:
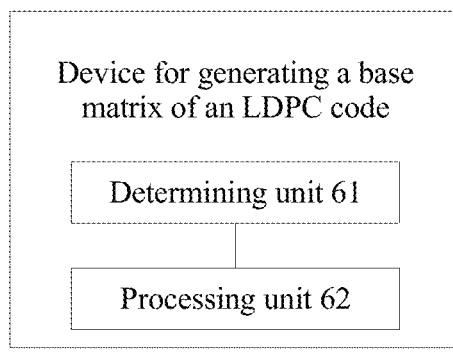
FIG. 13 is a schematic structural diagram of a device for generating a base matrix of an LDPC code according to an embodiment of the present disclosure.

When each function module is obtained through division for each function, FIG. 13 is a possible schematic structural diagram of a device for generating a base matrix of an LDPC code in the foregoing embodiment. As shown in FIG. 13, the device for generating a base matrix of an LDPC code may include a determining unit 61 and a processing unit 62.

The determining unit 61 is configured to support the device for generating a base matrix of an LDPC code in performing step 201, step 202, and step 203 in the method for generating a base matrix of an LDPC code shown in FIG. 2.

The processing unit 62 is configured to support the device for generating a base matrix of an LDPC code in performing step 204 in the method for generating a base matrix of an LDPC code shown in FIG. 2.

It should be noted that all related content of steps in the foregoing method embodiments may be cited in function descriptions of corresponding function modules. Details are not described herein again.

The device for generating a base matrix of an LDPC code provided in this embodiment of the present disclosure is configured to perform the foregoing method for generating a base matrix of an LDPC code, and therefore an effect the same as that of the foregoing method for generating a base matrix of an LDPC code can be achieved.

Figure 14:
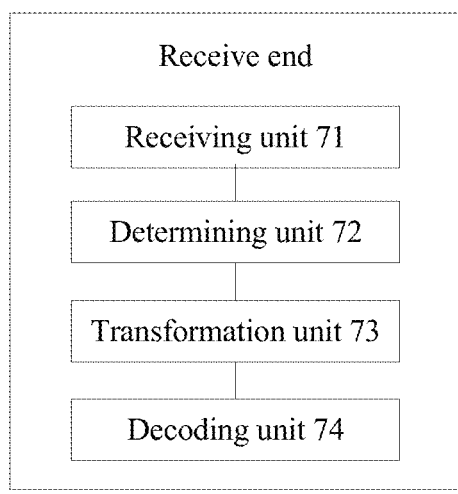
FIG. 14 is a schematic structural diagram of a receive end according to an embodiment of the present disclosure.

When each function module is obtained through division for each function, FIG. 14 is a possible schematic structural diagram of a receive end in the foregoing embodiment. The base matrix in the embodiment shown in FIG. 1 is preconfigured for the receive end. As shown in FIG. 14, the receive end may include a receiving unit 71, a determining unit 72, a transformation unit 73, and a decoding unit 74.

The receiving unit 71 is configured to support the receive end in performing step 301 in the decoding method shown in FIG. 5, step 508 in the encoding/decoding method shown in FIG. 7A, and step 519 in the encoding/decoding method shown in FIG. 8.

The determining unit 72 is configured to support the receive end in performing step 302 and step 303 in the decoding method shown in FIG. 5, step 509 and step 510 in the encoding/decoding method shown in FIG. 7B, step 514, step 520, and step 522 in the encoding/decoding method shown in FIG. 8, and step 514 in the encoding/decoding method shown in FIG. 9.

The transformation unit 73 is configured to support the receive end in performing step 304 in the decoding method shown in FIG. 5, step 511 in the encoding/decoding method shown in FIG. 7B, and step 523 in the encoding/decoding method shown in FIG. 8.

The decoding unit 74 is configured to support the receive end in performing step 305 in the decoding method shown in FIG. 5, step 512 and step 513 in the encoding/decoding method shown in FIG. 7B, and step 524 in the encoding/decoding method shown in FIG. 8.

Figure 15:
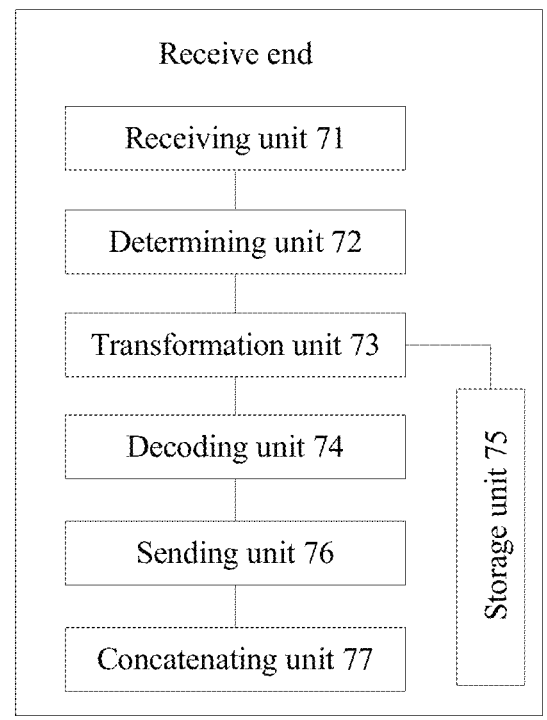
FIG. 15 is a schematic structural diagram of another receive end according to an embodiment of the present disclosure.

In this embodiment of the present disclosure, as shown in FIG. 15, the receive end may further include a storage unit 75.

For each column in a check bit part of the base matrix, the storage unit 75 pre-stores a correspondence between the column and a row corresponding to the column.

A $(2^j m)^{th}$ column in the check bit part corresponds to each of a $(2^k m)^{th}$ row, a $(2^k m-1)^{th}$ row, a $(2^k m-2)^{th}$ row, ..., and a $(2^k m-2^{k-k+1}+1)^{th}$ row of the base matrix; and a $(2^j m-1)^{th}$ column in the check bit part corresponds to each of a $(2^k m-2^{k-j+1})^{th}$ row, a $(2^k m-2^{k-j+1}-1)^{th}$ row, a $(2^k m-2^{k-j+1}-2)^{th}$ row, ..., and a $(2^k m-2^{k-j+2})^{th}$ row of the base matrix. By analogy, a $(2^{j-1} m+1)^{th}$ column in the check bit part corresponds to each of a $(2^{k-j+1})^{th}$ row, ..., a second row, and a first row of the base matrix, where j is an integer greater than 0 and less than k.

In this embodiment of the present disclosure, the receive end may further include a sending unit 76 and a concatenating unit 77.

The sending unit 76 is configured to support the receive end in performing step 515 and step 525 in the encoding/decoding method shown in FIG. 8, and step 515 and step 525 in the encoding/decoding method shown in FIG. 9.

The concatenating unit 77 is configured to support the receive end in performing step 521 in the encoding/decoding method shown in FIG. 8.

It should be noted that all related content of steps in the foregoing method embodiments may be cited in function descriptions of corresponding function modules. Details are not described herein again.

The receive end provided in this embodiment of the present disclosure is configured to perform the foregoing decoding method, and therefore an effect the same as that of the foregoing decoding method can be achieved.

Figure 16:
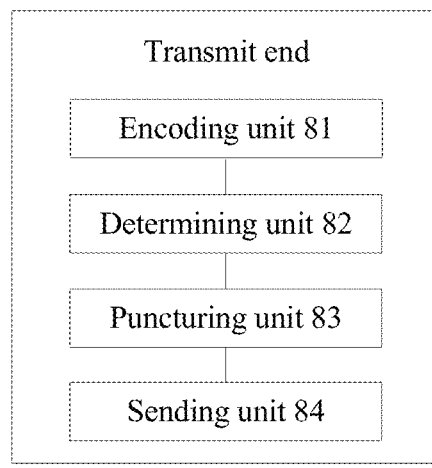
FIG. 16 is a schematic structural diagram of a transmit end according to an embodiment of the present disclosure.

When each function module is obtained through division for each function, FIG. 16 is a possible schematic structural diagram of a transmit end in the foregoing embodiment. The base matrix in the embodiment shown in FIG. 1 is preconfigured for the transmit end. As shown in FIG. 16, the transmit end may include an encoding unit 81, a determining unit 82, a puncturing unit 83, and a sending unit 84.

The encoding unit 81 is configured to support the transmit end in performing step 401 in the encoding method shown in FIG. 6, and step 501 in the encoding/decoding method shown in FIG. 7A.

The determining unit 82 is configured to support the transmit end in performing step 402 and step 403 in the encoding method shown in FIG. 6, and step 502 and step 503 in the encoding/decoding method shown in FIG. 7A.

The puncturing unit 83 is configured to support the transmit end in performing step 404 in the encoding method shown in FIG. 6, and step 504 in the encoding/decoding method shown in FIG. 7A.

The sending unit 84 is configured to support the transmit end in performing step 405 in the encoding method shown in FIG. 6, step 505, step 506, and step 507 in the encoding/decoding method shown in FIG. 7A, and step 518 in the encoding/decoding method shown in FIG. 8.

Figure 17:
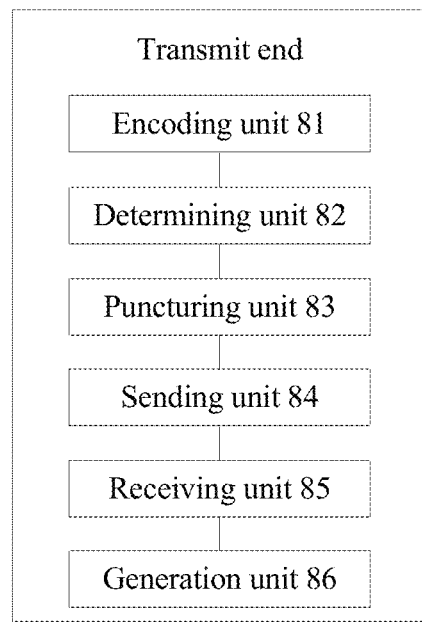
FIG. 17 is a schematic structural diagram of another transmit end according to an embodiment of the present disclosure.

In this embodiment of the present disclosure, as shown in FIG. 17, the transmit end may further include a receiving unit 85 and a generation unit 86.

The receiving unit 85 is configured to support the transmit end in performing step 516 in the encoding/decoding method shown in FIG. 8.

The generation unit 86 is configured to support the transmit end in performing step 517 in the encoding/decoding method shown in FIG. 8.

It should be noted that all related content of steps in the foregoing method embodiments may be cited in function descriptions of corresponding function modules. Details are not described herein again.

The transmit end provided in this embodiment of the present disclosure is configured to perform the foregoing encoding method, and therefore an effect the same as that of the foregoing encoding method can be achieved.

Figure 18:
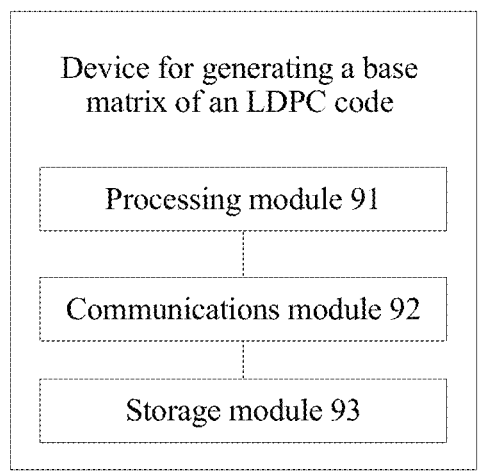
FIG. 18 is a schematic structural diagram of another device for generating a base matrix of an LDPC code according to an embodiment of the present disclosure.

When an integrated unit is used, FIG. 18 is a possible schematic structural diagram of a device for generating a base matrix of an LDPC code in the foregoing embodiment. As shown in FIG. 18, the device for generating a base matrix of an LDPC code includes a processing module 91 and a communications module 92.

The processing module 91 is configured to control and manage an action of the device for generating a base matrix of an LDPC code. For example, the processing module 91 is configured to support the device for generating a base matrix of an LDPC code in performing step 201, step 202, step 203, and step 204 in FIG. 2, and/or performing another process of the technology described in this specification. The communications module 92 is configured to support communication between the device for generating a base matrix of an LDPC code and another network entity, for example, communication between the device generating a base matrix of an LDPC code and a function module or a network entity shown in FIG. 1, FIG. 14, FIG. 15, FIG. 16, or FIG. 17. The device for generating a base matrix of an LDPC code may further include a storage module 93, configured to store program code and data of the device for generating a base matrix of an LDPC code.

The processing module 91 may be a processor or a controller. The processing module 91 may implement or execute various example logical blocks, modules, and circuits that are described with reference to the content disclosed in the present disclosure. The processor may also be a combination of computing functions, for example, a combination of one or more microprocessors or a combination of a DSP and a microprocessor. The communications module 92 may be a transceiver, a transceiver circuit, a communications interface, or the like. The storage module 93 may be a memory.

Figure 21:
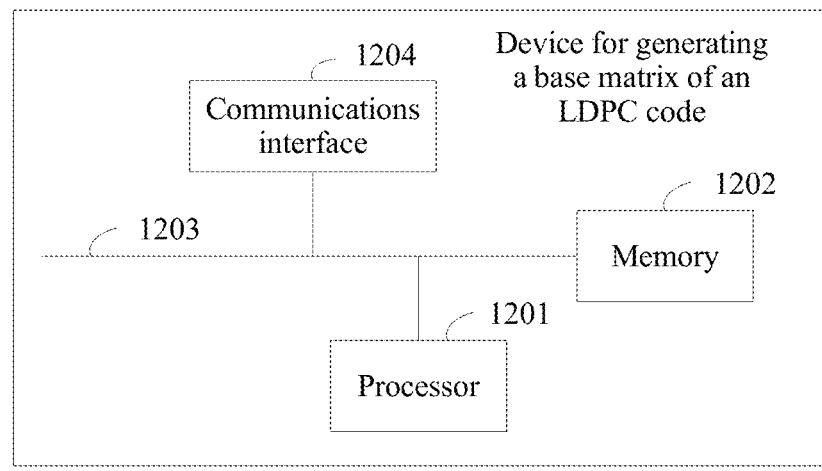
FIG. 21 is a schematic structural diagram of another device for generating a base matrix of an LDPC code according to an embodiment of the present disclosure.

When the processing module 91 is a processor, the communications module 92 is a communications interface, and the storage module 93 is a memory, the device for generating a base matrix of an LDPC code in this embodiment of the present disclosure may be a device for generating a base matrix of an LDPC code shown in FIG. 21.

Figure 19:
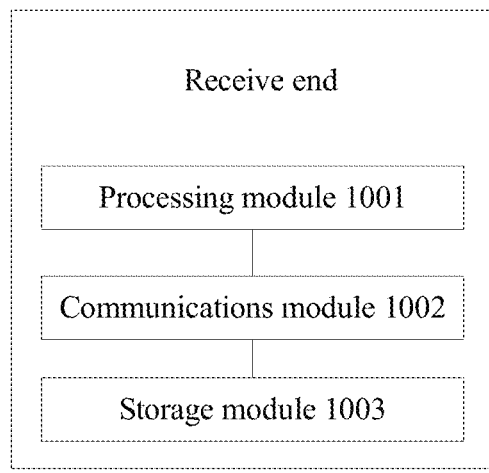
FIG. 19 is a schematic structural diagram of another receive end according to an embodiment of the present disclosure.

When an integrated unit is used, FIG. 19 is a possible schematic structural diagram of a receive end in the foregoing embodiment. As shown in FIG. 19, the receive end includes a processing module 1001 and a communications module 1002.

The processing module 1001 is configured to control and manage an action of the receive end. For example, the processing module 1001 is configured to support the receive end in performing step 302, step 303, step 304, and step 305 in FIG. 5, step 509, step 510, step 511, step 512, and step 513 in FIG. 7B, step 514, step 520, step 521, step 522, step 523, and step 524 in FIG. 8, and step 514 in FIG. 9; and/or performing another process of the technology described in this specification. The communications module 1002 is configured to support communication between the receive end and another network entity, for example, communication between the receive end and a function module or a network entity shown in FIG. 1, FIG. 13, FIG. 16, or FIG. 17.

The receive end may further include a storage module 1003, configured to store program code and data of the receive end. For example, for each column in a check bit part of a base matrix, the storage module 1003 is configured to store a correspondence between the column and a row corresponding to the column. A $(2^j m)^{th}$ column in the check bit part corresponds to each of a $(2^k m)^{th}$ row, a $(2^k m-1)^{th}$ row, a $(2^k m-2)^{th}$ row, . . . , and a $(2^k m-2^{k-j+1}+1)^{th}$ row of the base matrix; and a $(2^j m-1)^{th}$ column in the check bit part corresponds to each of a $(2^k m-2^{k-j+1})^{th}$ row, a $(2^k m-2^{k-j+1}-1)^{th}$ row, a $(2^k m-2^{k-j+1}-2)^{th}$ row, . . . , and a $(2^k m-2^{k-j+2})^{th}$ row of the base matrix. By analogy, a $(2^{j-1} m+1)^{th}$ column in the check bit part corresponds to each of a $(2^{k-j+1})^{th}$ row, . . . , a second row, and a first row of the base matrix, where j is an integer greater than 0 and less than k.

The processing module 1001 may be a processor or a controller. The processing module 1001 may implement or execute various example logical blocks, modules, and circuits that are described with reference to the content disclosed in the present disclosure. The processor may also be a combination of computing functions, for example, a combination of one or more microprocessors or a combination of a DSP and a microprocessor. The communications module 1002 may be a transceiver, a transceiver circuit, a communications interface, or the like. The storage module 1003 may be a memory.

Figure 22:
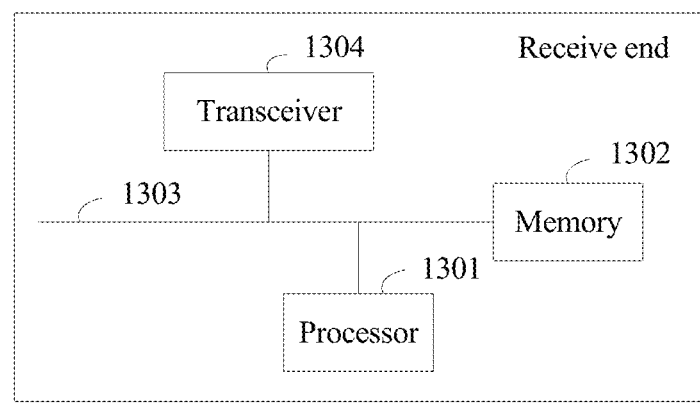
FIG. 22 is a schematic structural diagram of another receive end according to an embodiment of the present disclosure.

When the processing module 1001 is a processor, the communications module 1002 is a transceiver, and the storage module 1003 is a memory, the receive end in this embodiment of the present disclosure may be a receive end shown in FIG. 22.

Figure 20:
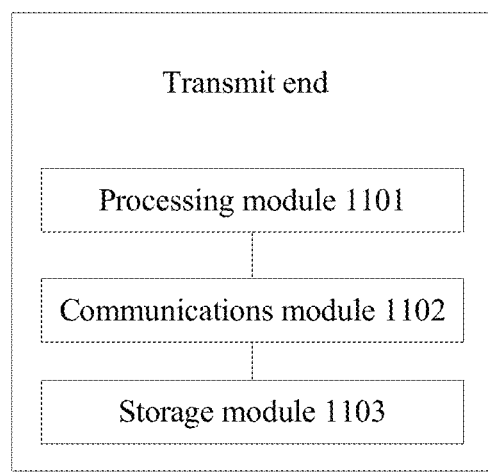
FIG. 20 is a schematic structural diagram of another transmit end according to an embodiment of the present disclosure.

When an integrated unit is used, FIG. 20 is a possible schematic structural diagram of a transmit end in the foregoing embodiment. As shown in FIG. 20, the transmit end includes a processing module 1101 and a communications module 1102.

The processing module 1101 is configured to control and manage an action of the transmit end. For example, the processing module 1101 is configured to support the transmit end in performing step 401, step 402, step 403, and step 404 in FIG. 6, step 501, step 502, step 503, and step 504 in FIG. 7A, and step 517 in FIG. 8; and/or performing another process of the technology described in this specification. The communications module 1102 is configured to support communication between the transmit end and another network entity, for example, communication between the transmit end and a function module or a network entity shown in FIG. 1, FIG. 13, FIG. 14, or FIG. 15. The transmit end may further include a storage module 1103, configured to store program code and data of the transmit end. For example, for each column in a check bit part of a base matrix, the storage module 1103 is configured to store a correspondence between the column and a row corresponding to the column. A $(2^j m)^{th}$ column in the check bit part corresponds to each of a $(2^k m)^{th}$ row, a $(2^k m-1)^{th}$ row, a $(2^k m-2)^{th}$ row, . . . , and a $(2^k m - 2^{k-j+1}+1)^{th}$ row of the base matrix; and a $(2^j m-1)^{th}$ column in the check bit part corresponds to each of a $(2^k m - 2^{k-j+1})^{th}$ row, a $(2^k m - 2^{k-j+1} - 1)^{th}$ row, a $(2^k m - 2^{k-j+1} - 2)^{th}$ row, . . . , and a $(2^k m - 2^{k-j+2})^{th}$ row of the base matrix. By analogy, a $(2^{j-1} m+1)^{th}$ column in the check bit part corresponds to each of a $(2^{k-j+1})^{th}$ row, . . . , a second row, and a first row of the base matrix, where j is an integer greater than 0 and less than k.

The processing module 1101 may be a processor or a controller. The processing module 1101 may implement or execute various example logical blocks, modules, and circuits that are described with reference to the content disclosed in the present disclosure. The processor may also be a combination of computing functions, for example, a combination of one or more microprocessors or a combination of a DSP and a microprocessor. The communications module 1102 may be a transceiver, a transceiver circuit, a communications interface, or the like. The storage module 1103 may be a memory.

Figure 23:
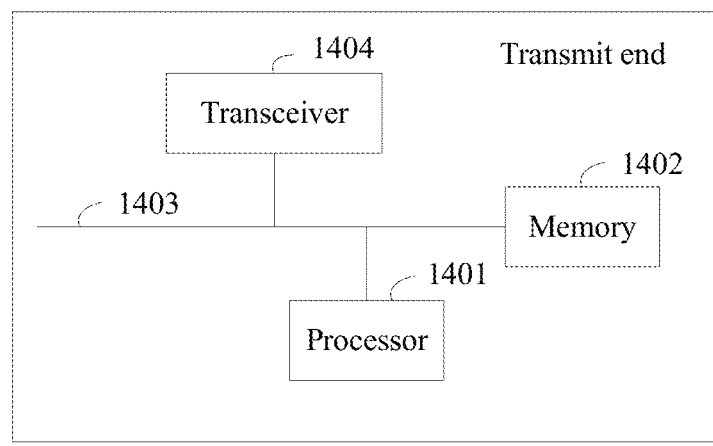
FIG. 23 is a schematic structural diagram of another transmit end according to an embodiment of the present disclosure.

When the processing module 1101 is a processor, the communications module 1102 is a transceiver, and the storage module 1103 is a memory, the transmit end in this embodiment of the present disclosure may be a transmit end shown in FIG. 23.

FIG. 21 is a schematic structural diagram of a device for generating a base matrix of an LDPC code according to an embodiment of the present disclosure. As shown in FIG. 21, the device for generating a base matrix of an LDPC code may include at least one processor 1201, a memory 1202, a system bus 1203, and a communications interface 1204.

The memory 1202 is configured to store a computer execution instruction, and the processor 1201 and the memory 1202 are connected by using the system bus 1203. When the device for generating a base matrix of an LDPC code runs, the processor 1201 executes the computer execution instruction stored in the memory 1202, so that the device for generating a base matrix of an LDPC code performs the method for generating a base matrix of an LDPC code in FIG. 2, to implement functions of the determining unit 61 and the processing unit 62 in the device for generating a base matrix of an LDPC code shown in FIG. 13.

For example, the processor 1201 executes the computer execution instruction stored in the memory 1202, so that the device for generating a base matrix of an LDPC code performs step 201 in the method for generating a base matrix of an LDPC code shown in FIG. 2, to implement a function of the determining unit 61 included in the device for generating a base matrix of an LDPC code shown in FIG. 13. For another example, the processor 1201 executes the computer execution instruction stored in the memory 1202, so that the device for generating a base matrix of an LDPC code performs step 202 in the method for generating a base matrix of an LDPC code shown in FIG. 2, to implement a function of the determining unit 61 included in the device for generating a base matrix of an LDPC code shown in FIG. 13. For another example, the processor 1201 executes the computer execution instruction stored in the memory 1202, so that the device for generating a base matrix of an LDPC code performs step 204 in the method for generating a base matrix of an LDPC code shown in FIG. 2, to implement a function of the processing unit 62 included in the device for generating a base matrix of an LDPC code shown in FIG. 13.

This embodiment further provides a storage medium. The storage medium may include the memory 1202.

The processor 1201 may be a central processing unit (CPU). The processor 1201 may be another general purpose processor, a digital signal processor (DSP), an application-specific integrated circuit (ASIC), a field programmable gate array (FPGA) or another programmable logic device, a discrete gate or a transistor logic device, or a discrete hardware component. The general purpose processor may be a microprocessor or the processor may be any conventional processor or the like.

The processor 1201 may be a dedicated processor, and the dedicated processor may include at least one of a baseband processing chip, a radio frequency processing chip, and the like.

The memory 1202 may include a volatile memory, for example, a random access memory (RAM); or the memory 1202 may include a nonvolatile memory, for example, a read-only memory (ROM), a flash memory, a hard disk drive (HDD), or a solid state drive (SSD); or the memory 1202 may include a combination of the foregoing types of memories.

The system bus 1203 may include a data bus, a power bus, a control bus, a signal status bus, and the like. For clear description in this embodiment, various buses are marked as the system bus 1203 in FIG. 21.

The communications interface 1204 may be specifically a transceiver in the device for generating a base matrix of an LDPC code. The transceiver may be a wireless transceiver. For example, the wireless transceiver may be an antenna or the like of the device for generating a base matrix of an LDPC code. The processor 1201 performs data receiving and sending with another device such as a transmit end or a receive end by using the communications bus 1204.

In a specific implementation process, all steps in the method procedure shown in FIG. 2 may be implemented in a manner in which the processor 1201 in a hardware form executes the computer execution instruction in a software form that is stored in the memory 1202. To avoid repetition, details are not described herein.

It should be noted that for a specific working process of each function module in the device for generating a base matrix of an LDPC code provided in this embodiment of the present disclosure, refer to the specific description of a corresponding process in the method embodiment. Details are not described herein again in this embodiment of the present disclosure.

The device for generating a base matrix of an LDPC code provided in this embodiment of the present disclosure is configured to perform the foregoing method for generating a base matrix of an LDPC code, and therefore an effect the same as that of the foregoing method for generating a base matrix of an LDPC code can be achieved.

FIG. 22 is a schematic structural diagram of another receive end according to an embodiment of the present disclosure. The base matrix in the embodiment shown in FIG. 1 is preconfigured for the receive end. As shown in FIG. 22, the receive end may include at least one processor 1301, a memory 1302, a system bus 1303, and a transceiver 1304.

The memory 1302 is configured to store a computer execution instruction, and the processor 1301 and the memory 1302 are connected by using the system bus 1303. When the receive end runs, the processor 1301 executes the computer execution instruction stored in the memory 1302, so that the receive end performs the decoding method in FIG. 5 or corresponding steps in the encoding/decoding method in any one of FIG. 7A to FIG. 9, to correspondingly implement functions of the receiving unit 71, the determining unit 72, the transformation unit 73, the decoding unit 74, the storage unit 75, the sending unit 76, and the concatenating unit 77 in the receive end in FIG. 14 or FIG. 15.

For example, the processor 1301 executes the computer execution instruction stored in the memory 1302, so that the receive end performs step 301 in the decoding method shown in FIG. 5, to implement a function of the receiving unit 71 included in the receive end shown in FIG. 14 or FIG. 15. For another example, the processor 1301 executes the computer execution instruction stored in the memory 1302, so that the receive end performs step 511 in the encoding/decoding method in FIG. 7B, to implement a function of the transformation matrix 73 included in the receive end shown in FIG. 14 or FIG. 15. For another example, the processor 1301 executes the computer execution instruction stored in the memory 1302, so that the receive end performs step 520 in the encoding/decoding method in FIG. 8, to implement a function of the concatenating unit 77 included in the receive end shown in FIG. 15.

This embodiment further provides a storage medium. The storage medium may include the memory 1302.

The processor 1301 may be a CPU. The processor 1301 may be another general purpose processor, a DSP, an ASIC, an FPGA or another programmable logic device, a discrete gate or a transistor logic device, a discrete hardware component, or the like. The general purpose processor may be a microprocessor or the processor may be any conventional processor or the like.

The processor 1301 may be a dedicated processor, and the dedicated processor may include at least one of a baseband processing chip, a radio frequency processing chip, and the like.

The memory 1302 may include a volatile memory, for example, a RAM; or the memory 1302 may include a non-volatile memory, for example, a ROM, a flash memory, an HDD, or an SSD; or the memory 1302 may include a combination of the foregoing types of memories.

The system bus 1303 may include a data bus, a power bus, a control bus, a signal status bus, and the like. For clear description in this embodiment, various buses are marked as the system bus 1303 in FIG. 22.

The transceiver 1304 may be a wireless transceiver. For example, the wireless transceiver may be an antenna or the like of the receive end. The processor 1301 performs data receiving and sending with another device such as a transmit end by using the transceiver 1304.

In a specific implementation process, all corresponding steps in the method procedures shown in FIG. 5 and FIG. 7A to FIG. 9 may be implemented in a manner in which the processor 1301 in a hardware form executes the computer execution instruction in a software form that is stored in the memory 1302. To avoid repetition, details are not described herein.

It should be noted that for a specific working process of each function module in the receive end provided in this embodiment of the present disclosure, refer to the specific description of a corresponding process in the method embodiment. Details are not described herein again in this embodiment of the present disclosure.

The receive end provided in this embodiment of the present disclosure is configured to perform the foregoing decoding method, and therefore an effect the same as that of the foregoing decoding method can be achieved.

FIG. 23 is a schematic structural diagram of another transmit end according to an embodiment of the present disclosure. The base matrix in the embodiment shown in FIG. 1 is preconfigured for the transmit end. As shown in FIG. 23, the transmit end may include at least one processor 1401, a memory 1402, a system bus 1403, and a transceiver 1404.

The memory 1402 is configured to store a computer execution instruction, and the processor 1401 and the memory 1402 are connected by using the system bus 1403. When the transmit end runs, the processor 1401 executes the computer execution instruction stored in the memory 1402, so that the transmit end performs the encoding method in FIG. 6 or the encoding/decoding method in any one of FIG. 7A to FIG. 9, to correspondingly implement functions of the encoding unit 81, the determining unit 82, the puncturing unit 83, the sending unit 84, the receiving unit 85, and the generation unit 86 in the transmit end in FIG. 16 or FIG. 17.

For example, the processor 1401 executes the computer execution instruction stored in the memory 1402, so that the transmit end performs step 401 in the encoding method in FIG. 6, to implement a function of the encoding unit 81 included in the transmit end shown in FIG. 16 or FIG. 17. For another example, the processor 1401 executes the computer execution instruction stored in the memory 1402, so that the transmit end performs step 504 in the encoding/decoding method in FIG. 7A, to implement a function of the puncturing unit 83 included in the transmit end shown in FIG. 16 or FIG. 17. For another example, the processor 1401 executes the computer execution instruction stored in the memory 1402, so that the transmit end performs step 526 in the encoding/decoding method in FIG. 9, to implement a function of the sending unit 84 included in the transmit end shown in FIG. 16 or FIG. 17.

This embodiment further provides a storage medium. The storage medium may include the memory 1402.

The processor 1401 may be a CPU. The processor 1401 may be another general purpose processor, a DSP, an ASIC, an FPGA or another programmable logic device, a discrete gate or a transistor logic device, a discrete hardware component, or the like. The general purpose processor may be a microprocessor or the processor may be any conventional processor or the like.

The processor 1401 may be a dedicated processor, and the dedicated processor may include at least one of a baseband processing chip, a radio frequency processing chip, and the like.

The memory 1402 may include a volatile memory, for example, a RAM; or the memory 1402 may include a non-volatile memory, for example, a ROM, a flash memory, an HDD, or an SSD; or the memory 1402 may include a combination of the foregoing types of memories.

The system bus 1403 may include a data bus, a power bus, a control bus, a signal status bus, and the like. For clear description in this embodiment, various buses are marked as the system bus 1403 in FIG. 23.

The transceiver 1404 may be a wireless transceiver. For example, the wireless transceiver may be an antenna or the like of the transmit end. The processor 1401 performs data receiving and sending with another device such as a receive end by using the transceiver 1404.

In a specific implementation process, all corresponding steps in the method procedures shown in FIG. 6 or FIG. 9 may be implemented in a manner in which the processor 1401 in a hardware form executes the computer execution instruction in a software form that is stored in the memory 1402. To avoid repetition, details are not described herein.

It should be noted that for a specific working process of each function module in the transmit end provided in this embodiment of the present disclosure, refer to the specific description of a corresponding process in the method embodiment. Details are not described herein again in this embodiment of the present disclosure.

The transmit end provided in this embodiment of the present disclosure is configured to perform the foregoing encoding method, and therefore an effect the same as that of the foregoing encoding method can be achieved.

The foregoing descriptions about implementations allow a person skilled in the art to understand that, for the purpose of convenient and brief description, division of the foregoing function modules is taken as an example for illustration. In actual application, the foregoing functions can be allocated to different modules and implemented according to a requirement, that is, an inner structure of an apparatus is divided into different function modules to implement all or part of the functions described above.

In the several embodiments provided in this application, it should be understood that the disclosed apparatus and method may be implemented in other manners. For example, the described apparatus embodiment is merely an example. For example, the module or unit division is merely logical function division and may be other division in actual implementation. For example, a plurality of units or components may be combined or integrated into another apparatus, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may be one or more physical units, may be located in one place, or may be distributed on different places. Some or all of the units may be selected according to actual needs to achieve the objectives of the solutions of the embodiments.

In addition, function units in the embodiments of the present disclosure may be integrated into one processing unit, or each of the units may exist alone physically, or two or more units are integrated into one unit. The integrated unit may be implemented in a form of hardware, or may be implemented in a form of a software function unit.

When the integrated unit is implemented in the form of a software function unit and sold or used as an independent product, the integrated unit may be stored in a readable storage medium. Based on such an understanding, the technical solutions in the present disclosure essentially, or the part contributing to the prior art, or all or some of the technical solutions may be implemented in the form of a software product. The software product is stored in a storage medium and includes several instructions for enabling a device (which may be a single-chip microcomputer, a chip, or the like) or a processor (processor) to perform all or some of the steps of the methods described in the embodiments of the present disclosure. The foregoing storage medium includes: any medium that can store program code, such as a USB flash drive, a removable hard disk, a ROM, a RAM, a magnetic disk, or an optical disc.

The descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method for generating a base matrix of a low-density parity-check (LDPC) code implemented by a electronic processor, the method comprising:

determining a size of a check bit part of a base matrix based on a required minimum bit rate;

determining the check bit part of the base matrix based on an initial matrix and the size of the check bit part, wherein the initial matrix is a matrix with a size of m×m that has a bidiagonal structure, the check bit part is a k-order transformation matrix $H_k$ obtained after the initial matrix is transformed k times, the k-order transformation matrix $H_k$ is a matrix with a size of $2^k m \times 2^k m$, k meets $2^{k-1}m < T \leq 2^k m$, and T is the size of the check bit part;

determining an information bit part of the base matrix based on the check bit part;

obtaining the base matrix based on the check bit part and the information bit part;

obtaining a signal based on the base matrix; and transmitting the signal to an receiving end through a channel; and, wherein an $i^{th}$ transformation in the k transformations comprises:

for an $a^{th}$ row of an (i−1)-order transformation matrix $H_{i-1}$, filling a $b^{th}$ location in a $(2a)^{th}$ row of a split matrix $S_i$ with a first non-negative element in the $a^{th}$ row, filling a $c^{th}$ location in a $(2a-1)^{th}$ row of the split matrix $S_i$ with a second non-negative element in the $a^{th}$ row, and filling a remaining location of the split matrix $S_i$ with an element −1, to obtain the split matrix $S_i$, wherein the split matrix $S_i$ is a matrix with a size of $2^i m \times 2^{i-1} m$, and i is an integer greater than 0 and less than or equal to k; when i=1, the (i−1)-order transformation matrix $H_{i-1}$ is the initial matrix; and the $a^{th}$ row is any row of the (i−1)-order transformation matrix $H_{i-1}$, b is a location that is of the first non-negative element in the $a^{th}$ row and that is in the $a^{th}$ row, c is a location that is of the second non-negative element in the $a^{th}$ row and that is in the $a^{th}$ row, and a, b, and c each are an integer greater than 0, generating a supplementary matrix $A_i$ according to $$A_{d,e} = \begin{cases} 0 & (d, e) \in \{(d, e), d = e*2 - 0 \vee d = e*2 - 1\} \\ -1 & \text{others} \end{cases},$$

wherein $A_{d,e}$ represents an element in a $d^{th}$ row and an $e^{th}$ column of the supplementary matrix $A_i$, d is an integer greater than 0 and less than $2^i m$, and e is an integer greater than 0 and less than $2^{i-1}m$, and concatenating the split matrix $S_i$ and the supplementary matrix $A_i$ to obtain an i-order transformation matrix $H_i=[S_i,A_i]$.

2. A decoding method for use by a receive end, the method comprising:

receiving, by the receive end, a low-density parity-check (LDPC) code sent by a transmit end at a preset initial transmission bit rate;

determining, by the receive end, the received LDPC code comprises a punctured bit;

determining, by the receive end based on a minimum bit rate and the initial transmission bit rate, a quantity x of columns that need to be deleted from a check bit part of a base matrix;

transforming, by the receive end, the base matrix to obtain a first matrix, wherein a bit rate of the first matrix is equal to the initial transmission bit rate, and the first matrix is a matrix obtained after the x columns in the check bit part are deleted starting from a last column in the check bit part of the base matrix and rows corresponding to each column are combined when the column is deleted; and decoding, by the receive end, the received LDPC code by using the first matrix.

3. The method according to claim 2, wherein for each column in the check bit part of the base matrix, pre-storing, by the receive end, a correspondence between the column and a row corresponding to the column, wherein:

a $(2^j m)^{th}$ column in the check bit part corresponds to each of a $(2^k m)^{th}$ row, a $(2^k m-1)^{th}$ row, a $(2^k m-2)^{th}$ row, ..., and a $(2^k m-2^{k-j+1}+1)^{th}$ row of the base matrix;

a $(2^j m-1)^{th}$ column in the check bit part corresponds to each of a $(2^k m-2^{k-j+1})^{th}$ row, a $(2^k m-2^{k-j+1}-1)^{th}$ row, a $(2^k m-2^{k-j+1}-2)^{th}$ row, ..., and a $(2^k m-2^{k-j+2})^{th}$ row of the base matrix; and by analogy, a $(2^{j-1} m+1)^{th}$ column in the check bit part corresponds to each of a $(2^{k-j+1})^{th}$ row, ..., a second row, and a first row of the base matrix, wherein j is an integer greater than 0 and less than k.

4. The method according to claim 2, wherein after decoding, by the receive end, the to-be-initially-transmitted LDPC code by using the first matrix, the method further comprises:

determining, by the receive end, that decoding on the received LDPC code fails;

sending, by the receive end, a negative acknowledgement (NACK) instruction to the transmit end;

receiving, by the receive end, to-be-retransmitted bits sent by the transmit end;

in response to a retransmission bit rate being greater than the minimum bit rate, concatenating, by the receive end, the to-be-retransmitted bits and all bits comprised in the LDPC code, to obtain a first LDPC code, wherein a bit rate of the first LDPC code is equal to the retransmission bit rate;

determining, by the receive end based on the minimum bit rate and the retransmission bit rate, a quantity y of columns that need to be deleted from the check bit part of the base matrix;

transforming, by the receive end, the base matrix to obtain a second transformation matrix, wherein the second transformation matrix is a matrix obtained after the y columns in the check bit part are deleted starting from the last column in the check bit part of the base matrix and rows corresponding to each column are combined when the column is deleted; and a bit rate of the second transformation matrix is equal to the retransmission bit rate; and decoding, by the receive end, the first LDPC code by using the second transformation matrix.

5. An encoding method for use by a transmit end, the method comprising:

encoding, by the transmit end, information by using a base matrix, to obtain a low-density parity-check (LDPC) code;

in response to a preset initial transmission bit rate being greater than a minimum bit rate, determining, by the transmit end based on the initial transmission bit rate and the minimum bit rate, a quantity of bits that need to be punctured;

puncturing, by the transmit end, the LDPC code from a last bit of the LDPC code based on the quantity of bits that need to be punctured, to generate a punctured LDPC code; and sending, by the transmit end, the punctured LDPC code to a receive end at the initial transmission bit rate.

6. The method according to claim 5, wherein after sending, by the transmit end, the punctured LDPC code to a receive end at the initial transmission bit rate, the method further comprises:

receiving, by the transmit end, a negative acknowledgement (NACK) instruction sent by the receive end;

in response to the NACK instruction, generating, by the transmit end, to-be-retransmitted bits based on a preset retransmission bit rate, wherein the to-be-retransmitted bits comprise some or all punctured bits, or the to-be-retransmitted bits comprise all punctured bits and bits obtained by repeating bits of the LDPC code one by one from a first bit; and sending, by the transmit end, the to-be-retransmitted bits to the receive end.

7. The method according to claim 6, further comprising:

in response to the transmit end receives again the NACK instruction sent by the receive end, re-generating, by the transmit end, first to-be-retransmitted bits, and sending the first to-be-retransmitted bits to the receive end until receiving an acknowledgement (ACK) instruction sent by the receive end or a quantity of retransmissions reaches a preset threshold.

* * * * *